(12) United States Patent
Manipatruni et al.

(10) Patent No.: US 9,195,787 B2
(45) Date of Patent: Nov. 24, 2015

(54) METHODS AND APPARATUS FOR MODELING AND SIMULATING SPINTRONIC INTEGRATED CIRCUITS

(71) Applicants: Sasikanth Manipatruni, Hillsboro, OR (US); Dmitri E. Nikonov, Beaverton, OR (US); Ian A. Young, Portland, OR (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 13/682,358

(22) Filed: Nov. 20, 2012

(65) Prior Publication Data

US 2014/0142915 A1    May 22, 2014

(51) Int. Cl.
G06F 17/50    (2006.01)
(52) U.S. Cl.
CPC .................................. *G06F 17/5036* (2013.01)
(58) Field of Classification Search
USPC ............................ 703/2, 6; 716/105; 365/158
See application file for complete search history.

(56) References Cited

U.S. PATENT DOCUMENTS

| | | | |
|---|---|---|---|
| 5,379,231 A | 1/1995 | Pillage et al. | |
| 6,807,520 B1 | 10/2004 | Zhou et al. | |
| 6,810,506 B1 | 10/2004 | Levy | |
| 8,832,614 B2 * | 9/2014 | Vrudhula et al. | 716/105 |
| 2005/0251377 A1 | 11/2005 | Zhao | |
| 2008/0250369 A1 | 10/2008 | Lai et al. | |
| 2012/0281460 A1 * | 11/2012 | Abraham et al. | 365/158 |

OTHER PUBLICATIONS

Notice of Preliminary Rejection issued for the Korean Patent Application No. 10-2012-138583, mailed Sep. 26, 2013, 7 pages.
Notification of Transmittal of the International Search Report and the Written Opinion of the International Searching Authority issued for International Patent Application No. PCT/US2013/066452, mailed Jan. 29, 2014, 9 pages.

* cited by examiner

*Primary Examiner* — Thai Phan
(74) *Attorney, Agent, or Firm* — Blakely, Sokoloff, Taylor & Zafman LLP

(57) ABSTRACT

Described are apparatus and method for simulating spintronic integrated circuit (SPINIC), the method comprising: generating a spin netlist indicating connections of spin nodes of spin circuits and nodes of general circuits; and modifying a modified nodal analysis (MNA) matrix for general circuits to generate a spin MNA matrix for solving spin circuits and general circuits of the spin netlist.

21 Claims, 13 Drawing Sheets

Scalar current in a branch of a circuit

Vector charge current in 3D

Vector spin current in a branch of a circuit

Tensor spin current in 3D

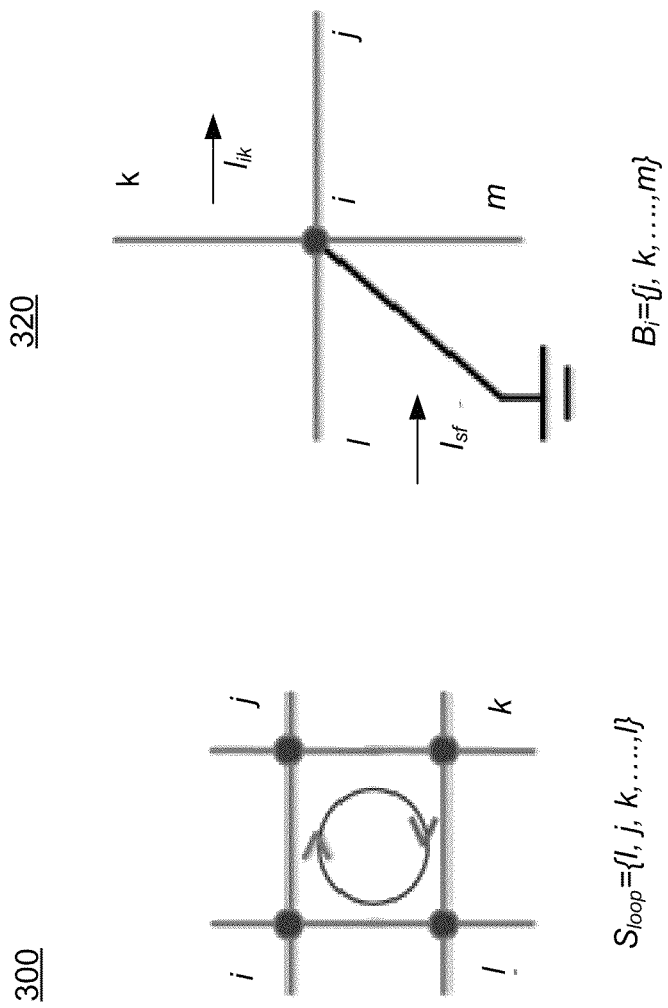

$$\begin{bmatrix} I_1 \\ \cdot \\ \cdot \\ I_n \\ V \end{bmatrix} = \begin{bmatrix} G \\ \text{Conductance} \\ \text{Matrix} \end{bmatrix} \begin{bmatrix} V_1 \\ \cdot \\ \cdot \\ V_n \\ I_v \end{bmatrix}$$

Current Sources / Voltage Sources = G Conductance Matrix · Node Voltages / Current through Voltage Sources

$$\begin{bmatrix} I_1 \\ \cdot \\ \cdot \\ I_n \\ V \end{bmatrix} = \begin{bmatrix} G \\ \text{Conductance} \\ \text{Matrix} \end{bmatrix} \begin{bmatrix} V_1 \\ \cdot \\ \cdot \\ V_n \\ I_v \end{bmatrix}$$

Spin Current Sources / Spin Voltage Sources = G Conductance Matrix · Spin Node Voltages / Spin Current through Voltage Sources

Fig. 10A
An STTRAM Cell

Fig. 10B
A magnetic tunnel junction (MTJ)

$$\begin{bmatrix} G_{11} & \alpha G_{11} & 0 & 0 \\ \alpha G_{11} & G_{11} & 0 & 0 \\ 0 & 0 & G_{sz} & \sim 0 \\ 0 & 0 & \sim 0 & G_{sz} \end{bmatrix}$$

Fig. 10C
Spin SPICE macro-model for MJT

Fig. 10D
Spin Netlist for MTJ

```
V3 2 0 1
RF1 2 1 GF1
RF2 2 0 GF2
RF3 2 0 Gsf0
```

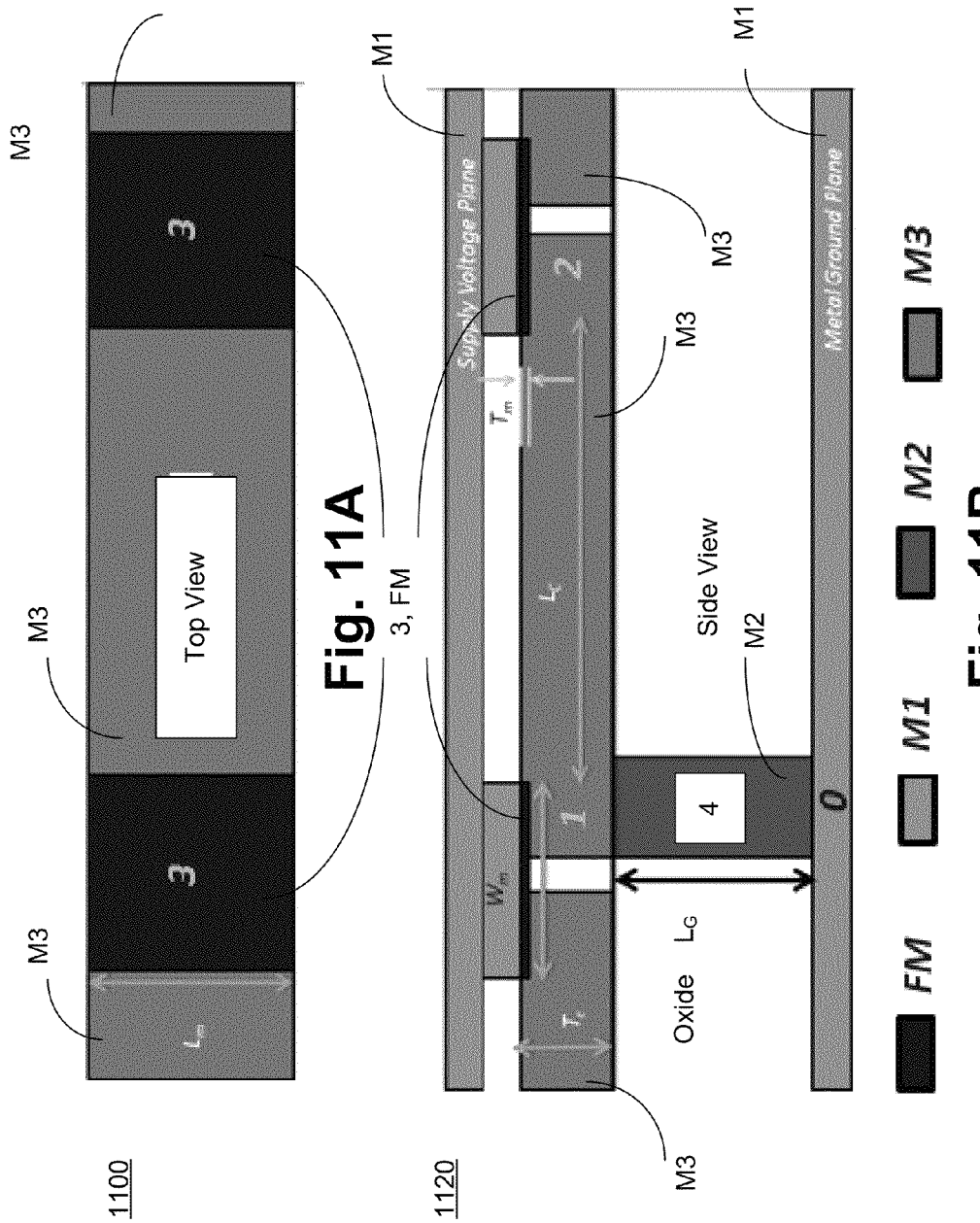

1140

Spin net list

```
V3    3 0 1
RF1   1 3 GF1
RF2   2 3 GF2
Rs1   1 0 Gsfp
Rs2   2 0 Gsfp
Rse   1 2 Gsep
RsT1  1 4 GseT
RsT   4 0 GsfT
RsT2  4 0 GseT
```

Fig. 11D

METHODS AND APPARATUS FOR MODELING AND SIMULATING SPINTRONIC INTEGRATED CIRCUITS

BACKGROUND

Existing tools (e.g., SPICE) for simulating integrated circuits are not equipped to simulate magnetic memory and spin logic elements. The deficiencies of existing tools are caused, for example, due to the vectorial nature of spin current and spin voltages. Furthermore, simulating magnetic memory and spin logic elements with traditional circuits (e.g., CMOS based circuits) together is not possible by existing SPICE-like circuit simulation tools.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3A is a conceptual diagram of conservation laws for spin voltages and currents, where the sum of loop voltages differences is zero.

FIG. 3B is a conceptual diagram of conservation laws for spin voltages and currents, where the sum of physical spin currents from all physical branches is equal to the spin flip current to a virtual ground, according to one embodiment.

FIG. 8A is a modified nodal analysis (MNA) matrix equation for normal circuits.

FIG. 8B is a spin-MNA matrix equation for spin circuits, according to one embodiment.

FIG. 10A is a spintronic random access memory (STTRAM) cell.

FIG. 10B is a zoomed version of the magnetic tunnel junction of the STTRAM cell.

FIG. 10C is a circuit model of the STTRAM, according to one embodiment.

FIG. 10D is a spin netlist of the STTRAM cell, according to one embodiment.

FIG. 11A is a top view of a lateral spin logic device.

FIG. 11B is a side view of the lateral spin logic device.

FIG. 11D is a spin netlist of the lateral spin logic device which is parsed and analyzed by a spin-MNA method, according to one embodiment.

DETAILED DESCRIPTION

Figure 1A:
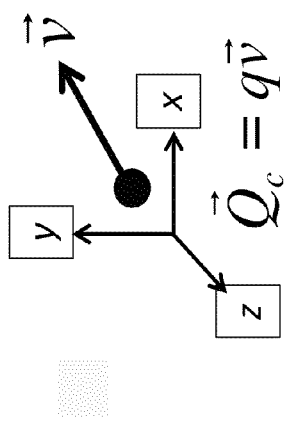
FIG. 1A is a conceptual diagram of two nodes in a circuit connected by a conductance branch, where the two nodes are connected by a scalar conductance in a regular circuit.

The embodiments disclose a method and apparatus for theoretical and numerical formalism for analysis and design of spintronic integrated circuits (SPINICs). In one embodiment, the formalism encompasses a generalized circuit theory for SPINICs based on nano-magnetic dynamics and spin transport. In one embodiment, the Modified Nodal Analysis (MNA) technique is extended or modified for the analysis of spin circuits based on spin conduction matrices.

Spintronics is a technology of control and manipulation of spin state of electrons and nano-magnets. Several spin based devices have been proposed with the possibility of logic-non-volatility, intrinsic directionality, higher logical efficiency (large fan-in/fan-out) and re-configurability. Magnetic memories are an example of spin based devices that use a Magnetic Tunneling Junction (MTJ) device having a fixed or pinned layer and a free layer as described in "Current Switching in MgO-Based Magnetic Tunneling Junctions," IEEE Transactions on Magnetics, Vol. 47, No. 1, January 2011 (beginning at page 156) by Zhu, et al. The direction of magnetization in the free magnet (FM) layer is switched from one direction to another through spin transfer torque using a spin-polarized current. This direction determines whether an MTJ device is storing a logical 1 or a logical 0. When the magnetizations of the free and fixed/pinned layer (PM) of an MTJ device are aligned (parallel to one another) the magnetic resistance ($R_P$) of the MTJ device is lower than when the moments are opposite or anti-parallel ($R_{AP}$). Lower resistance can be identified as '1' and higher resistance as '0.'

SPINICs exhibit promising trends for non-volatile operation, low energy-delay products and better logical efficiency. However, current SPICE-like circuit simulators do not simulate SPINICs. The embodiments describe method and apparatus for simulating SPINICs using SPICE based simulations. In one embodiment, the methods for simulating SPINICs are based on the physical principles for spin transport. In one embodiment, the method uses formalism for 4×4 spin conduction matrices which enable the combined analysis of nano-magnets connected by spin transport channels. In one embodiment, the method forms circuit level transport models for spintronic devices from the physics of the spin transport through nano-magnets and nano-channels. In one embodiment, the method generalizes Kirchoff's conservation laws (KCL and KVL) for spin circuits to include spin dissipation. In one embodiment, the method extends the principles of MNA to spin circuits enabling Netlist based SPICE simulations to simulate SPINICs.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" herein refers to converting a design (schematic and layout) from one process technology to another process technology. The terms "substantially," "close," "approximately," "near," "about," herein refer to being within +/−20% of a target value.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1A is a conceptual diagram 100 of two nodes in a circuit connected by a conductance branch, where the two nodes are connected by a scalar conductance in a regular circuit. To develop the formalism for spin conduction, a branch of generic circuit is considered comprising of two nodes $N_1$ and $N_2$ connected by a conduction element $B_{12}$. As electrons move from $N_2$ to $N_1$, the current direction is indicated by the arrow from $N_1$ to $N_2$, where v1 and v2 are scalar potential voltages at nodes $N_1$ and $N_2$ respectively.

Figure 1C:
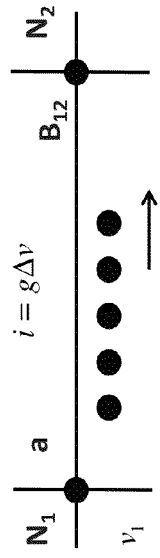
FIG. 1C is a conceptual diagram of a spin current tensor when a spin current flows in a three dimensional (3D) space, according to one embodiment.
Figure 1B:
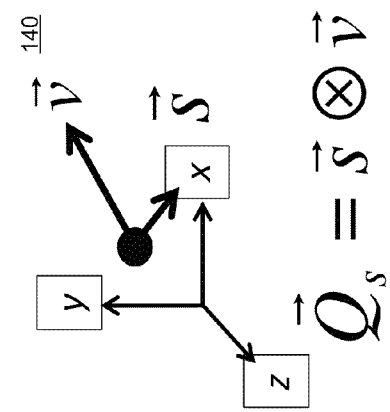
FIG. 1B is a conceptual diagram of two nodes in a circuit connected by a spin conductance in a spin circuit, according to one embodiment.

FIG. 1B is a conceptual diagram 120 of two nodes in a circuit connected by a spin conductance in a spin circuit, according to one embodiment. In this embodiment, spin current is shown as a vector spin current with currents in the three Cartesian coordinates. The 1×4 matrices under nodes $N_1$ and $N_2$ are the vector spin voltages $\vec{V}_s$ (with three Cartesian components specified by three scalar numbers) for nodes $N_1$ and $N_2$, respectively. The current equation in the center represents the vector spin current $\vec{I}_z$ (with the three Cartesian components specified by three scalar numbers).

Figure 1D:
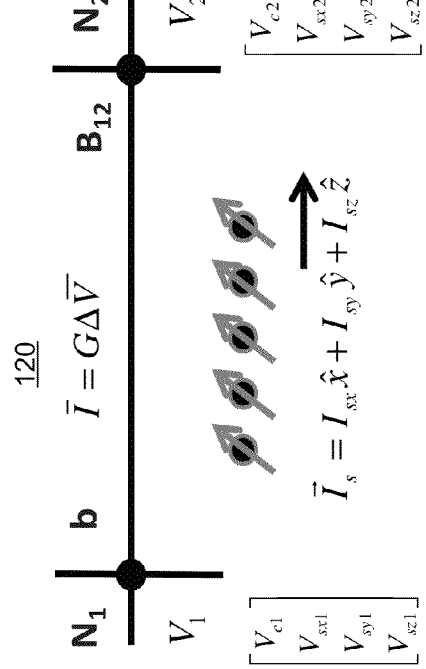
FIG. 1D is a conceptual diagram of a spin current tensor reduced to a spin current vector when a direction is implied by a branch of the circuit.

FIG. 1C is a conceptual diagram 130 of a spin current tensor when a spin current flows in a three dimensional (3D) space, according to one embodiment. FIG. 1D is a conceptual diagram 140 of a spin current tensor reduced to a spin current vector when a direction is implied by a branch of the circuit. In one embodiment, the current and the voltages in a spin circuit are four component vectors carrying both the scalar current/voltage quantities and vector spin current/voltage quantities. In one embodiment, the linearity of the circuit implies that the connecting branch is described by an n×n (e.g., 4×4) spin conductance matrix, where 'n' is an integer.

In the embodiments discussed herein, the node of a spin circuit is generally defined as a collection of physical points in a device or a circuit where all the quantities of interest for spin and charge transport are at equilibrium. So as not to obscure the embodiments of the disclosure, the mechanisms driving the node to the state of equilibrium are assumed to be much faster than the dynamics of the circuit.

In the embodiments discussed herein, vector spin current in a branch of a spin circuit is generally defined as the net vector flow of magnetic moment along the branch of the circuit. It is expressed in the units of amperes. In the embodiments discussed herein, the spin current flowing in a 3D space is a tensor. The spin tensor is described by a direction of the flow of the charges constituting the spin current and the direction of the net magnetic moment (spin) of the charges along each axis of the Cartesian coordinates (as shown by FIGS. 1C-D). However, in a circuit, the direction of the flow of charges is defined by the connectivity of the branch and therefore, the spin current flowing between two points of a spin circuit is a vector expressed as:

$$\vec{I}_s = I_{sx}\hat{x} + I_{sy}\hat{y} + I_{sz}\hat{z} \qquad (\text{Eq. 1})$$

The spin current can be related to the velocity and spin states of the carriers in a circuit/device. In one embodiment, the components of the vector spin current are expressed as a sum over the momentum k states of electrons, normalized to density of electrons, and expressed as:

$$I_{sj} = -e \sum_{A,k} Tr(\rho \hat{\sigma}_j) v_n \qquad (\text{Eq. 2.1})$$

where $\sigma_j$ are Pauli matrices, A is cross sectional area, $v_n$ is the velocity component normal to it, and ρ is the spin density matrix. It is defined with the negative sign to reflect the negative charge of electrons, similarly to the electric charge current expressed as:

$$I_c = -e \sum_{A,k} v_n \quad \text{(Eq. 2.2)}$$

In the embodiments, the spin current corresponds to the flux of magnetic moments. Thus, in FIG. 1A, the electrical current (arrow to the right) is opposite to the flux of electrons (arrow to the left). If the net spin projection is positive, then the spin current, (arrow in FIG. 1B) is opposite to the flux of electrons.

In the embodiments discussed herein, vector spin voltage at a node is expressed as:

$$\vec{V}_s = V_{sx}\hat{x} + V_{sy}\hat{y} + V_{sz}\hat{z} \quad \text{(Eq. 3)}$$

In one embodiment, Eq. 3 can be understood as the state variable associated with the accumulation of spins of a certain direction. It is related to the half-difference in the electrochemical potentials of the electrons with their spin up and down along the direction of this vector. In one embodiment, this difference can be related to the half-difference of density of the electrons with spin up and spin down, Δn, following the Valet-Fert theory expressed as:

$$-e\vec{V}_s = \Delta\vec{\mu} = (\Delta\mu_x\hat{x} + \Delta\mu_y\hat{y} + \Delta\mu_z\hat{z}) = \frac{4}{3}\frac{\Delta\vec{n}}{n}\mu \quad \text{(Eq. 4)}$$

where n is the total density, $\vec{\mu}$ is the electrochemical potential.

Figure 2:
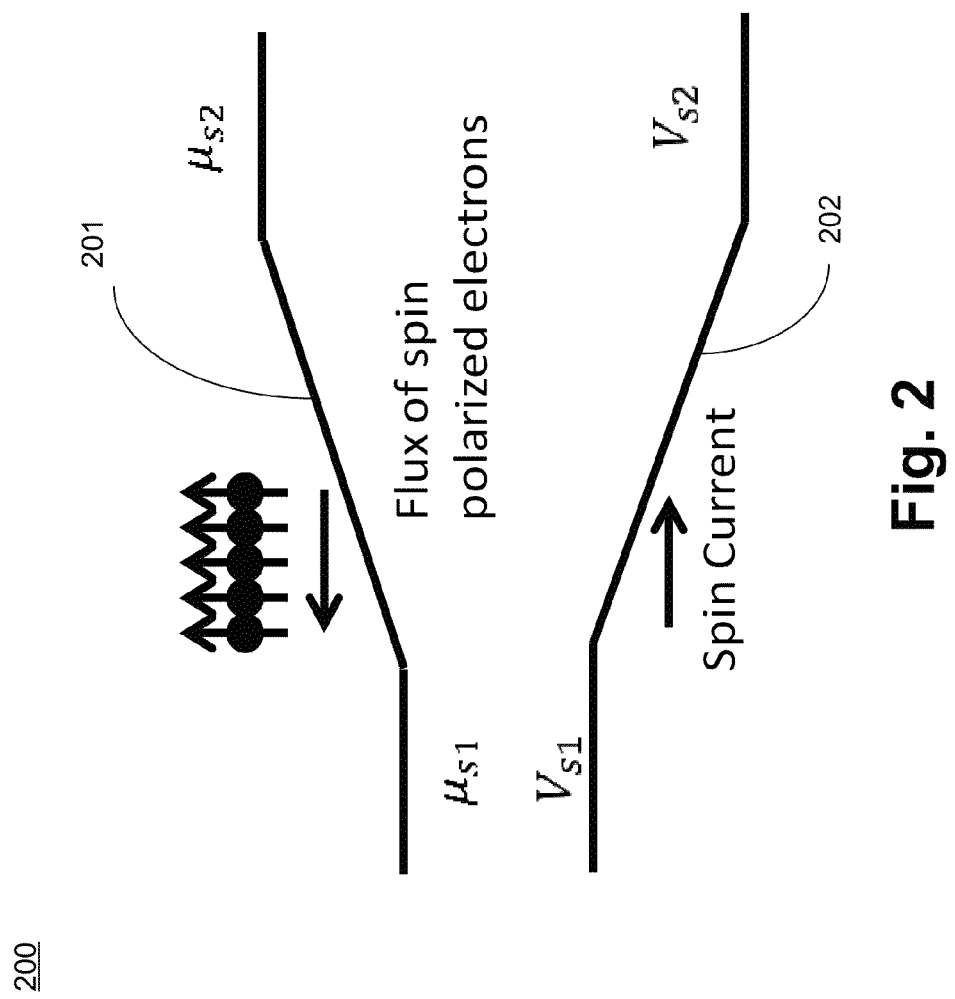
FIG. 2 is a conceptual diagram showing accumulation of spin up electrons expressed in a higher spin electrochemical potential, where diffusion current of up spin electrons flows from a higher to lower spin electrochemical potential, and where spin current flows from higher spin voltages to lower spin voltages.

FIG. 2 is a conceptual diagram 200 showing accumulation of spin up electrons expressed in a higher spin electrochemical potential, where diffusion current of up spin electrons flows from a higher to lower spin electrochemical potential as indicated by 201, and where spin current flows from higher spin voltages to lower spin voltages as shown by 202. It is pointed out those elements of FIG. 2 having the same reference numbers (or names) as the elements of any other figure can operate or function in any manner similar to that described, but are not limited to such.

In the embodiments, spin voltage is defined with the negative sign as well. It is done to make the definition consistent to the usual electrochemical potential for electrons, which includes the term of voltage with a negative sign. FIG. 2 illustrates the choice of signs in the definitions of spin current and spin voltage which makes most of the relationships similar to those between charge current and voltage.

In the embodiments, the total spin current is defined generally as the combination of the charge current and vector spin current. In one embodiment, it is a 4×1 column vector expressed as:

$$\vec{I} = [I_c, I_{sx}, I_{sy}, I_{sz}]^T \quad \text{(Eq. 5)}$$

In the embodiments, the ratio between the charge current and the magnitude of the spin current is defined to be the current's spin polarization ratio, which is expressed as:

$$\alpha_c = \left|\frac{\vec{I}_s}{I_c}\right| \quad \text{(Eq. 6)}$$

In the embodiments, the total spin voltage vector (V) is the combination of the scalar columbic potential and the vector spin potential. It is a 4×1 column vector expressed as:

$$\vec{V} = [V_c, V_{sx}, V_{sy}, V_{sz}]^T \quad \text{(Eq. 7a)}$$

In the embodiments, the ratio between the scalar potential and the magnitude of the spin potential is the voltage-spin polarization ratio of a node, which is expressed as:

$$\beta = \left|\frac{e\vec{V}_s}{\mu}\right| = \frac{4}{3}\frac{|\Delta\vec{n}|}{n} \quad \text{(Eq. 7b)}$$

The concept of spin conduction matrix can be derived by postulating the linear response of current to voltage. This assumption is expected to be valid in metals, where electron density is high and electric fields change slowly compared to the scattering time. In the worst case, the branches of the circuit are considered small enough to make it a good approximation. In the embodiments, spin Ohm's law, which is the linear relationship of spin voltage to spin current is expressed as:

$$\vec{I} = G\Delta\vec{V} \quad \text{(Eq. 8)}$$

In the embodiments, G is the 4×4 conductance matrix expressed as:

$$G = \begin{bmatrix} G_{11} & G_{12} & G_{13} & G_{14} \\ G_{21} & G_{22} & G_{23} & G_{24} \\ G_{31} & G_{32} & G_{33} & G_{34} \\ G_{41} & G_{42} & G_{43} & G_{44} \end{bmatrix} \quad \text{(Eq. 9)}$$

G can also be interpreted as a 4×4 tensor that scales and reorients the voltage vectors to obtain the spin current vector. Therefore, the spin conductance matrix of a conductance element is the matrix proportionality constant relating the vector spin current through an element with the vector spin voltage difference applied across a conductance element. In general, the 16 components of spin conduction matrix are non-zero and are set by the magnetic and geometric properties of the spin conductance element.

Table 1 below provides a list of variables for spin circuit theory which are used in formulating the simulation model and method flowchart.

TABLE 1

List of variables for spin circuit theory

| Variable | Notation | Matrix Size | Units (SI) |
| --- | --- | --- | --- |
| Vector Spin Current | $\vec{I}_s$ | 3 × 1 | A |
| Total Vector Spin Current | $\vec{I}$ | 4 × 1 | A |
| Vector Spin voltage | $\vec{V}$ | 3 × 1 | V |
| Total Vector Spin voltage | $\vec{V}$ | 4 × 1 | V |
| Spin Conductance | G | 4 × 4 | $\Omega^{-1}$ |
| Spin Population Polarization | Δn | 3 × 1 | $m^{-3}$ |
| Spin Current Polarization | $\alpha_c$ | 1 × 1 | Unitless |
| Spin Voltage Polarization | β | 1 × 1 | Unitless |

The following embodiments describe the extension of the Kirchoff's current and voltage laws (KCL, KVL) to spin circuits which are used by the methods discussed. The conservation laws setup a set of equations governing the currents and voltages. Kirchhoff's voltage law extension for spin currents is based on the traditional voltage law for circuits. The traditional voltage law for circuits is extended to spin circuits since the sum of voltage differences in any closed loop is zero. The voltage law extension for spin currents is expressed as:

$$\sum_{i,j \in S_{loop}} \overline{V}_i - \overline{V}_j = 0 \qquad \text{(Eq. 10)}$$

where $S_{loop}$ is the set of all node pairs in a given closed loop.

Apart from the vectorial nature of spin currents and voltages, the difference between spin circuits and electric circuits is that charge is strictly conserved, but spin is not. The embodiments handle the non-conservative nature of the spin currents entering a node by introducing a spin dissipation current to a virtual ground. The traditional Kirchhoff's current law is thus extended to spin circuits as follows: the sum of the vector spin currents entering node is equal to the total dissipated vector spin current at the node, which is expressed as:

$$\sum_{j \in B_i} \vec{I}_{ij} - \vec{I}_{d,i} = 0 \qquad \text{(Eq. 11)}$$

At node i, the spin node current law is given by Eq. 11, where $\vec{I}_{ij}$ is the spin current from node i to node j; $B_i$ is the set of all nodes connected to node i; $I_{d,i}$ is the total spin current dissipated due to spin flip events happening at the node ($I_{sf}$).

In view of the above discussion, FIG. 3A is a conceptual diagram 300 of conservation laws for spin voltages and currents, where the sum of loop voltages differences is zero while FIG. 3B is a conceptual diagram 320 of conservation laws for spin voltages and currents, where the sum of physical spin currents from all physical branches is equal to the spin flip current to a virtual ground, according to one embodiment.

The following embodiments describe spin conduction matrices for non-magnetic elements (NME) including non-magnetic channels, and series and parallel elements.

The spin conduction through a linear non-magnetic conductive element (non-magnetic channel) can be described as follows: a) the charge current through the device is directly proportional to the applied scalar voltage difference, and b) the spin vector current though the element is directly proportional and collinear to the vector spin voltage difference applied to the NME. The spin conduction through a linear non-magnetic conductive element can be expressed as:

$$I_c = g\Delta V_c \qquad \text{(Eq. 12)}$$

$$\vec{I}_s = g_s \Delta \vec{V}_s \qquad \text{(Eq. 13)}$$

where $g_s$ is a scalar quantity, $\Delta \vec{V}_s$ is the applied spin vector voltage across the NME, g is the scalar conductance, and $\Delta V_c$ is the applied voltage difference.

Using the concept of spin conduction through non-magnetic elements, the conductance of a series resistor can be expressed as:

$$G_{se} = \begin{bmatrix} g & 0 & 0 & 0 \\ 0 & g_s & 0 & 0 \\ 0 & 0 & g_s & 0 \\ 0 & 0 & 0 & g_s \end{bmatrix} \qquad \text{(Eq. 14)}$$

In one embodiment, a resistor with no spin flip is described fully by a single element as shown in Eq. (14). However, a series resistor with spin-flip includes a spin flip conductance to accommodate for the loss of spin current.

The following embodiment is a spin-flip conductance to handle a non-spin-ballistic resistor. In one embodiment, the conductance of a spin flip resistor is expressed as:

$$G_{sf} = \begin{bmatrix} 0 & 0 & 0 & 0 \\ 0 & g_{sh} & 0 & 0 \\ 0 & 0 & g_{sh} & 0 \\ 0 & 0 & 0 & g_{sh} \end{bmatrix} \qquad \text{(Eq. 15)}$$

where $g_{sh}$ is the spin flip conductance to accommodate the loss of spin polarization. In one embodiment, the spin flip conductance sinks the spin current to a virtual spin ground to emulate spin current conservation even in presence of spin flip events.

Figure 4A:
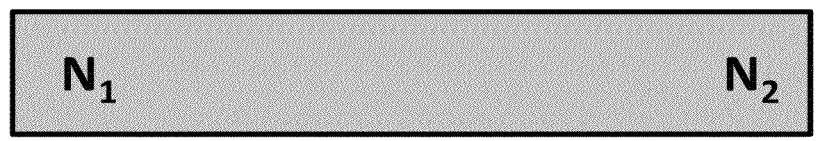
FIG. 4A is a normal metal connecting nodes $N_1$ and $N_2$.
Figure 4B:
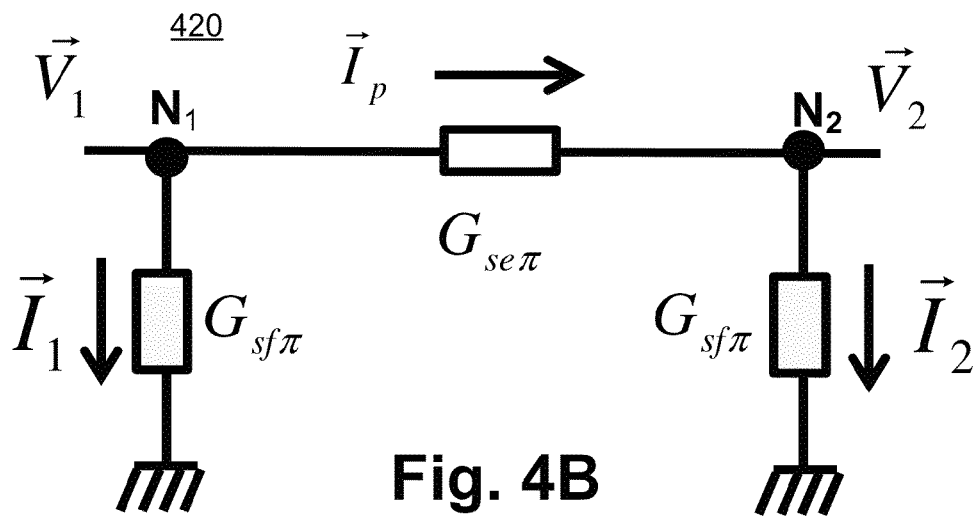
FIG. 4B is a Π-equivalent circuit representing the distributed channel, according to one embodiment.
Figure 4C:
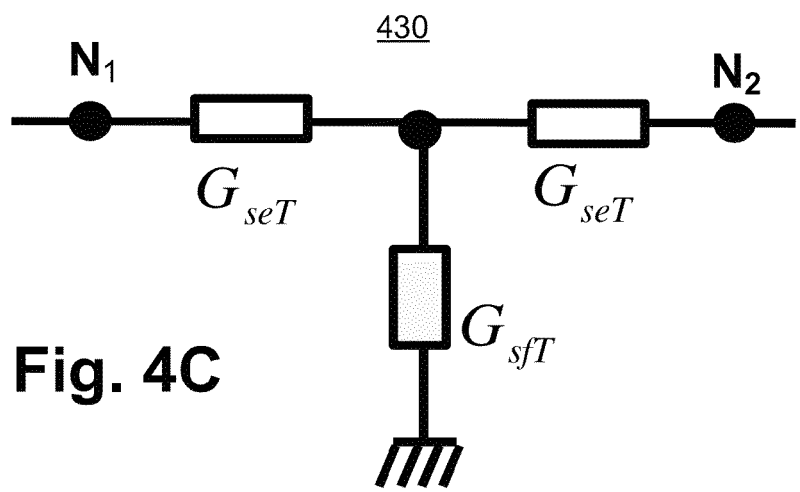
FIG. 4C is a T-equivalent circuit representing the distributed channel, according to one embodiment.

FIG. 4A is a normal metal 400 connecting nodes $N_1$ and $N_2$. FIG. 4B is a Π (Pi) equivalent circuit 420 representing the distributed channel, according to one embodiment. FIG. 4C is a T-equivalent circuit 430 representing the distributed channel, according to one embodiment. FIGS. 4A-C are described together. The spin conduction model for distributed channels in Π-equivalent (as shown in FIG. 4B) and T-equivalent (as shown in FIG. 4A) networks can be expressed using the shunt and series conductances described above.

FIG. 4A illustrates a non-magnetic channel connecting two nodes of a spin circuit $N_1$ and $N_2$. In one embodiment, the process of spin flip which causes a loss of spin current from the channel is modeled using shunt resistances which go to the spin voltage ground $[0\ 0\ 0\ 0]^T$ of FIG. 4B. No charge current flows through the shunt elements since the conductance components $G_{1i}$ are zero. Depending on the ground conditions, a T-model (FIG. 4C) may be more convenient than the Π-model (FIG. 4B).

In one embodiment, the equivalent conductances in the Π-equivalent circuit for a non-ballistic elastic channel with cross section area of the channel $A_{ch}$, channel resistivity $\rho_{ch}$, the channel length $L_c$, spin-flip length of the channel material $\lambda_s$, is expressed as follows:

$$G_{seT} = G_{sfix} + 2G_{se\pi} \qquad \text{(Eq. 16)}$$

$$G_{sfT} = 2G_{sfix} + G_{sfix}G_{se\pi}^{-1}G_{sfix} \qquad \text{(Eq. 17)}$$

In contrast to spin conduction through non-magnetic elements, spin conduction through magnetic elements in general can have; (a) coupling between scalar voltages and spin currents and (b) the spin current can be non-collinear to the vector spin voltage difference. The following describes the conduction from a ferro-magnet to a normal metal.

Spin conduction from a ferro-magnet to a normal metal can be understood as the spin dependent current in response to spin voltages. The spin voltage at a node is in turn a result of a spin polarized population set up via spin injection from elsewhere. Microscopically, the conduction is happening via spin dependent reflection and transmission at the interface of the ferro-magnet and the normal metal. Much of the formalism is derived from quantum transport scattering theory, and draws on the work from superconductive transport.

Figure 5:
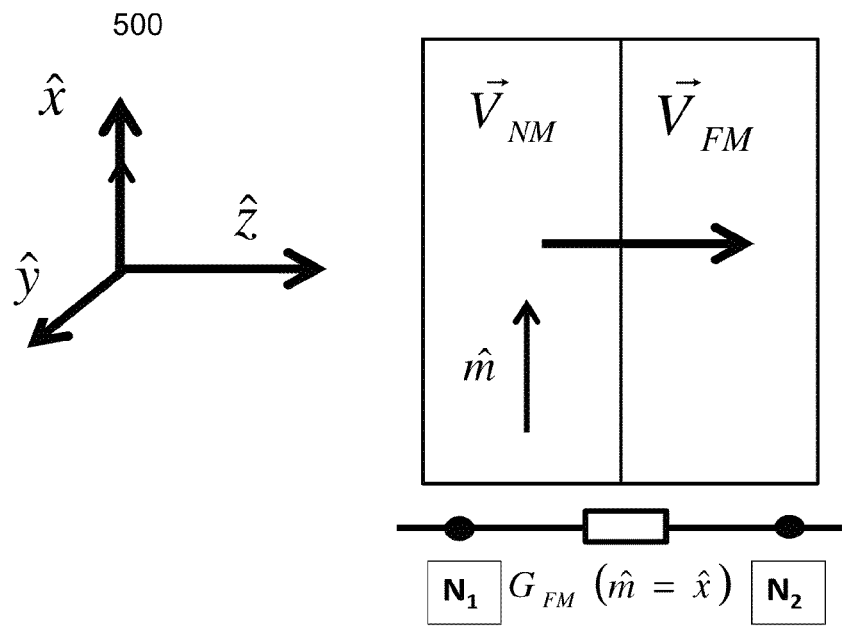
FIG. 5 is a circuit model for spin transport between a ferro-magnet (FM) and a normal metal (NM), where the FM is treated as a node with a specific vector spin voltage, according to one embodiment.

FIG. 5 is a circuit model 500 for spin transport between a ferro-magnet (FM) and a normal metal (NM), where the FM is treated as a node with a specific vector spin voltage, according to one embodiment. In one embodiment, a 4×4 conduction matrix of a FM to NM interface is derived from the spin conduction equations. In one embodiment, the elements of the spin conduction matrix are filled with experimental properties.

For example, the 4×1 spin voltages at the FM and NM can be expressed as $\vec{V}_{FM}=[V_F;0]$ and $\vec{V}_{NM}=[V_N;\vec{V}_{sp}]$ respectively. So as not to obscure the embodiments, the spin accumulation in FM is ignored. Accordingly, $\vec{I}_{FN}=[I_c;\vec{I}_s]$ cab be the 4×1 spin current from FM to NM and $\hat{m}$ can be the vector direction of the magnet's magnetic moment. Then, the charge current is expressed as:

$$I_C = G(V_N - V_F) + \alpha G \hat{m} \cdot \vec{V}_{sp} \quad \text{(Eq. 18)}$$

In one embodiment, the total spin current is expressed as:

$$\vec{I}_s = \vec{I}_\| + \vec{I}_\perp \quad \text{(Eq. 19)}$$

$$\vec{I}_\| = G(\alpha(V_N - V_F) + \hat{m} \cdot \vec{V}_{sp})\hat{m} \quad \text{(Eq. 20)}$$

$$\vec{I}_\perp = G_{SL}[\hat{m} \times [\vec{V}_{sp} \times \hat{m}]] + G_{FL}(\vec{V}_{sp} \times \hat{m}) \quad \text{(Eq. 21)}$$

where $\vec{I}_\|$ is the component of the spin current parallel to the magnetic moment and $\vec{I}_\perp$ is the spin current perpendicular to the magnetic moment. The expressions for spin torque conductances $G_{SL}$, and $G_{FL}$ are related to the spin reflection and transmission properties of the interface.

In one embodiment, the spin conduction matrix elements are deduced from experimental properties of the FM-NM interface. For example, G is the value of the total conductance of the interface, α is the spin selectivity of the FM-NM interface, and $G_{SL}$ is the spin transfer conductance of the normal metal. In one embodiment, the Sharvin conductance is the quantum limit of this term. $G_{FL}$ is the field-like conductance term which is typically zero for many metal interfaces. It is encountered at higher voltages in tunneling barriers adjacent to ferro-magnets.

In one embodiment, the conduction matrix in a special case of the magnetization parallel to the plane of the interface is derived as shown in FIG. 5. In this embodiment, a coordinate system is selected such that the x-axis is along the direction of magnetization $\hat{m}=\hat{x}$ and the other two axes form a right-handed coordinates. Then using projections to these coordinates, equations (18)-(21) can be expressed as:

$$I_C = G_{11}(V_N - V_F) + \alpha G_{11} V_{sx} \quad \text{(Eq. 22)}$$

$$I_{sx} = \alpha G_{11}(V_N - V_F) + G_{11} V_{sx} \quad \text{(Eq. 23)}$$

$$I_{s\perp} = G_{SL}(V_{sy}\hat{y} + V_{sz}\hat{z}) + G_{FL}(V_{sz}\hat{y} - V_{sy}\hat{z}) \quad \text{(Eq. 24)}$$

Hence, the generalized Ohm's law for the FM-NM interface is expressed as:

$$\begin{bmatrix} I_c \\ I_{sx} \\ I_{sy} \\ I_{sz} \end{bmatrix} = \begin{bmatrix} G_{11} & \alpha G_{11} & 0 & 0 \\ \alpha G_{11} & G_{11} & 0 & 0 \\ 0 & 0 & G_{SL} & G_{FL} \\ 0 & 0 & -G_{FL} & G_{SL} \end{bmatrix} \begin{bmatrix} V_N - V_F \\ V_{sx} \\ V_{sy} \\ V_{sz} \end{bmatrix} \quad \text{(Eq. 25)}$$

In one embodiment, since Eqs. (18)-(21) are independent of the orientation of the interface, it can be extended by induction that the same expression for the conduction matrix is valid for any direction of magnetization provided that the coordinate system has its x-axis aligned to it, $\hat{m}=\hat{x}$:

$$G_{FN}(\hat{x}) = \begin{bmatrix} G_{11} & \alpha G_{11} & 0 & 0 \\ \alpha G_{11} & G_{11} & 0 & 0 \\ 0 & 0 & G_{SL} & G_{FL} \\ 0 & 0 & -G_{FL} & G_{SL} \end{bmatrix} \quad \text{(Eq. 26)}$$

Figure 6:
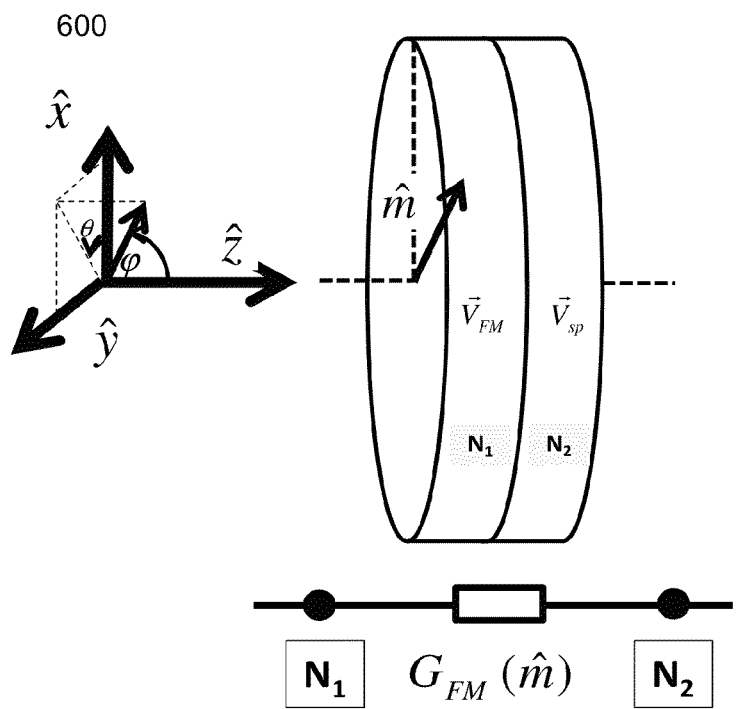
FIG. 6 is a circuit model for spin transport between a FM and an NM, where the FM magnetization may point in any direction in three dimensions as determined by the nano-magnet dynamics, according to one embodiment.

FIG. 6 is a circuit model 600 for spin transport between a FM and a NM, where the FM magnetization may point in any direction in three dimensions as determined by the nano-magnet dynamics, according to one embodiment. In one embodiment, spin conduction matrix of the FM-NM interface in the fixed coordinate system tied to the nano-magnet shape (e.g., elliptical, see FIG. 6) rather than the instantaneous direction of magnetization is expressed as a 4×4 conduction matrix in the fixed coordinate system. In one embodiment, the 4×4 conduction matrix in the fixed coordinate system is expressed as:

$$G_{FN}(\hat{m}) = R^{-1}(\hat{m}) G_{FN}(\vec{x}) R(\hat{m}) \quad \text{(Eq. 27)}$$

where R is the rotation matrix is expressed as:

$$R(\hat{m}) = \begin{bmatrix} 1 & 0 & 0 & 0 \\ 0 & r_{22} & r_{23} & r_{24} \\ 0 & r_{32} & r_{33} & r_{33} \\ 0 & r_{42} & r_{43} & r_{44} \end{bmatrix} \quad \text{(Eq. 28)}$$

In one embodiment, the elements of the rotation matrix R are defined by the expression of the unit vectors of the axes (X, Y, Z) tied to the magnetization in terms of the fixed coordinates (x,y,z) as shown below:

$$[r_{22} r_{23} r_{24}] = \hat{X} = \hat{m} \quad \text{(Eq. 29)}$$

$$[r_{32} r_{33} r_{34}] = \hat{Y} = -(\hat{X} \times \hat{x})/\|\hat{X} \times \hat{x}\| \quad \text{(Eq. 30)}$$

$$[r_{42} r_{43} r_{44}] = \hat{Z} = \hat{X} \times \hat{Y} \quad \text{(Eq. 31)}$$

Table 2 illustrates transport parameters used in spin circuit theory as discussed in the embodiments.

TABLE 2

Transport parameters used in spin circuit theory

| Variable | Notation | Typical value | Units (SI) |
|---|---|---|---|
| Spin flip length of ferromagnetic metals | $\lambda_s$ | 5 (NiFe, Py)-50 (Co) | nm |
| Spin flip length of normal metals | $\lambda_n$ | 200-1000 | nm |
| Spin current polarization | $\alpha_c$ | 0.3-0.5 | — |
| Sharvin conductivity of a normal metal | $G_{sh}$ | 0.47 (Co)-0.58 (Cu) × $10^{15}$ | $\Omega^{-1} \cdot m^{-2}$ |

The following embodiments describe self-consistency of nano-magnet dynamics with spin circuit analysis with a coupled spin transport-magnetization dynamics model for solving spin integrated circuits which employ nano-magnets for spin injection. The phenomenological equation describing the dynamics of nano-magnet with a magnetic moment unit vector ($\hat{M}$), the modified Landau-Lifshitz-Gilbert (LLG) equation, with spin transfer torques is (see Table 3 for parameters) expressed as:

$$\frac{\partial \hat{m}}{\partial t} = -\gamma\mu_0[\hat{m}\times\vec{H}_{\mathit{eff}}] + \alpha\left[\hat{m}\times\frac{\partial m}{\partial t}\right] + \frac{\vec{I}_\perp}{eN_s} \quad \text{(Eq. 32)}$$

where $\gamma$ is the electron gyromagnetic ratio; $\mu_0$ is the free space permeability; $\vec{H}_{\mathit{eff}}$ is the effective magnetic field due to material/geometric/surface anisotropy; $\alpha$ is the Gilbert damping of the material, $\vec{I}_\perp$ is the component of vector spin current perpendicular to the magnetization ($\hat{m}$) leaving the nano-magnet, and $N_s$ is the total number of Bohr magnetons per magnet. $\vec{I}_\perp$ can also be rewritten as $\vec{I}_\perp = \vec{I}_z - \hat{m}(\hat{m}\cdot\vec{I}_z) = \hat{m}\times(\vec{I}_s\times\hat{m})$. The positive sign of the spin torque term is related to the fact that the spin current has the same direction as the flux of magnetic moments. Implicit in the LLG equation is the fact that absolute values of the magnetic moments of single domain nano-magnets remain substantially constant.

TABLE 3

Nano-magnet parameters for spin circuit theory used in combination with a macrospin nano-magnet model

| Variable | Notation | Value/Typical Value | Units (SI) |
|---|---|---|---|
| Free Space Permeability | $\mu_0$ | $4\pi \times 10^{-7}$ | $JA^{-2}m^{-1}$ |
| Gyromagnetic ratio | $\gamma$ | $17.6 \times 10^{10}$ | $s^{-1}T^{-1}$ |
| Saturation Magnetization of the Magnet | $M_s$ | $10^6$ | A/m |
| Damping of the Magnet | $\alpha$ | 0.007-0.01 | — |
| Barrier Height | $E_b$ | 40-100 | kT |
| Effective Internal Anisotropic Field | $H_{\mathit{eff}}$ | $10^3$-$10^6$ | A/m |
| Number of Bohr magnetons in the nano-magnet | $N_s$ | $10^3$-$10^6$ | — |

Figure 7A:
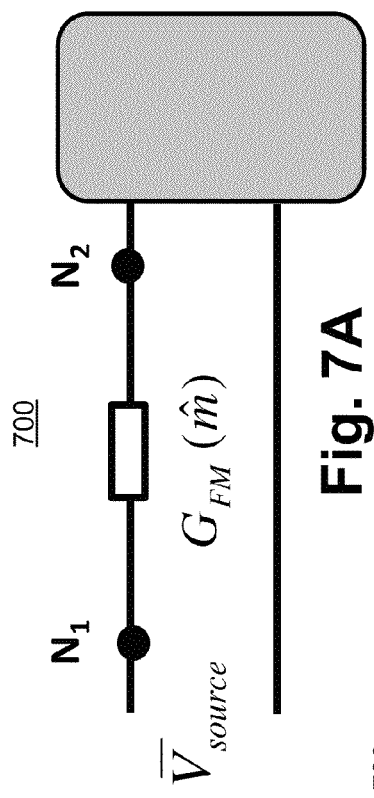
FIG. 7A is a circuit model showing the need for self-consistency of nano-magnet dynamics with spin transport, according to one embodiment.

FIG. 7A is a spin circuit model 700 showing the need for self-consistency of nano-magnet dynamics with spin transport, according to one embodiment. In general, the direction of the nano-magnet magnetic moments of a spin circuit and the spin transport via a spin circuit are coupled together. The spin current entering a nano-magnet is defined by the conductance of the nano-magnet at the present angular position. This is because the equivalent conductance of the nano-magnet is determined by the direction the nano-magnet's moment. In one embodiment, the current passing through the circuit 700 depends on the direction of the magnet ($\hat{m}$) while the direction of the magnet is modified depending on the injected spin current. Hence, at each instant of time a self-consistent solution may need to be calculated to ensure accuracy.

Figure 7B:
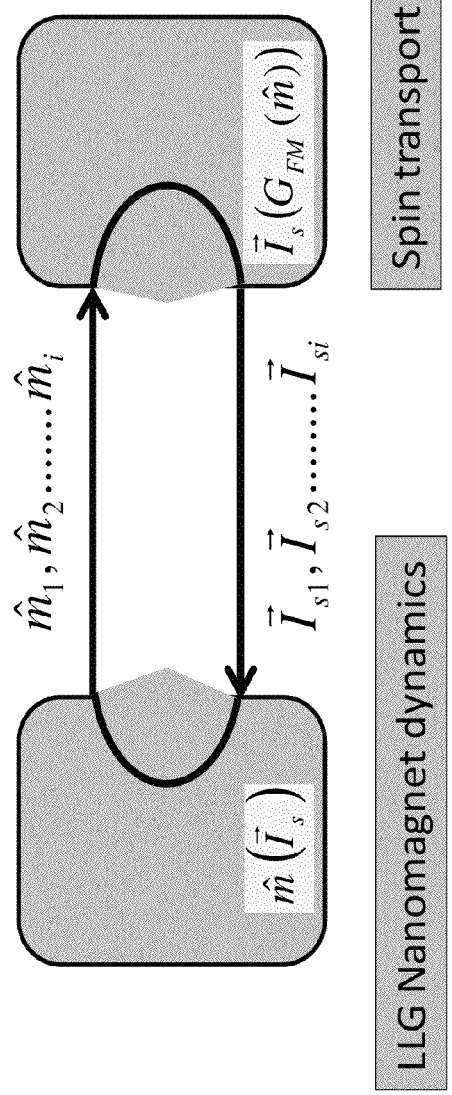
FIG. 7B is a model showing for self-consistency between Lifshitz-Gilbert (LLG) dynamics and spin transport, according to one embodiment.

FIG. 7B is a model 720 showing for self-consistency between LLG dynamics and spin transport, according to one embodiment. In one embodiment, the model 720 shows the self-consistent loop between LLG nano-magnet dynamics and spin transport. In one embodiment, the LLG solvers pass the condition of the magnets to the spin circuit and the spin circuit solver passes the spin vector current to the LLG solver at each pass of the self-consistent loop till a solution is reached. In one embodiment, self-consistency can also be addressed by using an implicit numerical solver.

The following embodiments described the extension of modified nodal analysis (MNA) to spin circuits to provide a scalable method for analyzing multi-node systems.

A computational method for solving spin circuits is applied even for few node circuits (nodes>2) because the ordering of the spin conduction matrices is used while calculating equivalent conductances. In one embodiment, spin-MNA solves the following equation:

$$[X]=[A]^{-1}[Z] \quad \text{(Eq. 33)}$$

where A is a matrix based on the connectivity of the circuit, location of the voltage and current sources; X is the vector comprising unknown node voltages and unknown currents through the voltage sources; and Z is the vector comprising of the voltages of the voltage sources and currents at the current sources. In one embodiment, matrix A can be also be expressed as:

$$A = \begin{bmatrix} G & B \\ C & D \end{bmatrix} \quad \text{(Eq. 34)}$$

where matrix A has the size $4(m+n)\times 4(m+n)$ (n is the number of nodes, and m is the number of independent voltage sources). In one embodiment, matrix G has the size $4n\times 4n$ and is determined by the interconnections between the passive circuit elements. In one embodiment, matrix B has the size $4n\times 4m$ and is determined by the connection of the voltage sources. In one embodiment, matrix C has the size $4m\times 4n$ and is determined by the connection of the voltage sources. In one embodiment, matrices B and C may be closely related, particularly when only independent sources are considered. In one embodiment, matrix D is $4m\times 4m$ and is zero if only independent sources are considered.

In one embodiment, the spin currents entering the magnets can be extracted as the Cartesian components of the total spin current. For example, for a magnet connected between $i^{th}$ and $j^{th}$ nodes, the spin current entering $i^{th}$ node is expressed as:

$$\vec{I}_{ij}=G(i,j)(\vec{V}_i-\vec{V}_j) \quad \text{(Eq. 35)}$$

In one embodiment, matrix A can be assembled as shown in FIGS. 8A-B. FIG. 8A is a MNA matrix equation 800 for normal circuits. FIG. 8B is a spin-MNA matrix equation 820 for spin circuits, according to one embodiment.

The method discussed in the embodiments can handle a combination of nonmagnetic and magnetic elements as well as dependent and independent spin/regular voltage and current sources. In one embodiment, the solution of the spin MNA equation can be simplified by optimal ordering of the equations to obtain sparsity among other optimization techniques. Known algorithms for parsing a netlist to do MNA may be used.

Table 4 illustrates Spin MNA matrices and their sizes.

TABLE 4

Spin MNA Matrices

| Variable | Size in MNA | Size in Spin-MNA |
|---|---|---|
| X | (m + n)X(m + n) | (4m + 4n)X(4m + 4n) |
| A | (n + m)X1 | (4n + 4m)X1 |
| Z | (n + m)X1 | (4n + 4m)X1 |
| G | nXn | 4nX4n |
| B | nXm | 4nX4m |
| C | mXn | 4mX4n |
| D | mXm | 4mX4m |

Figure 9:
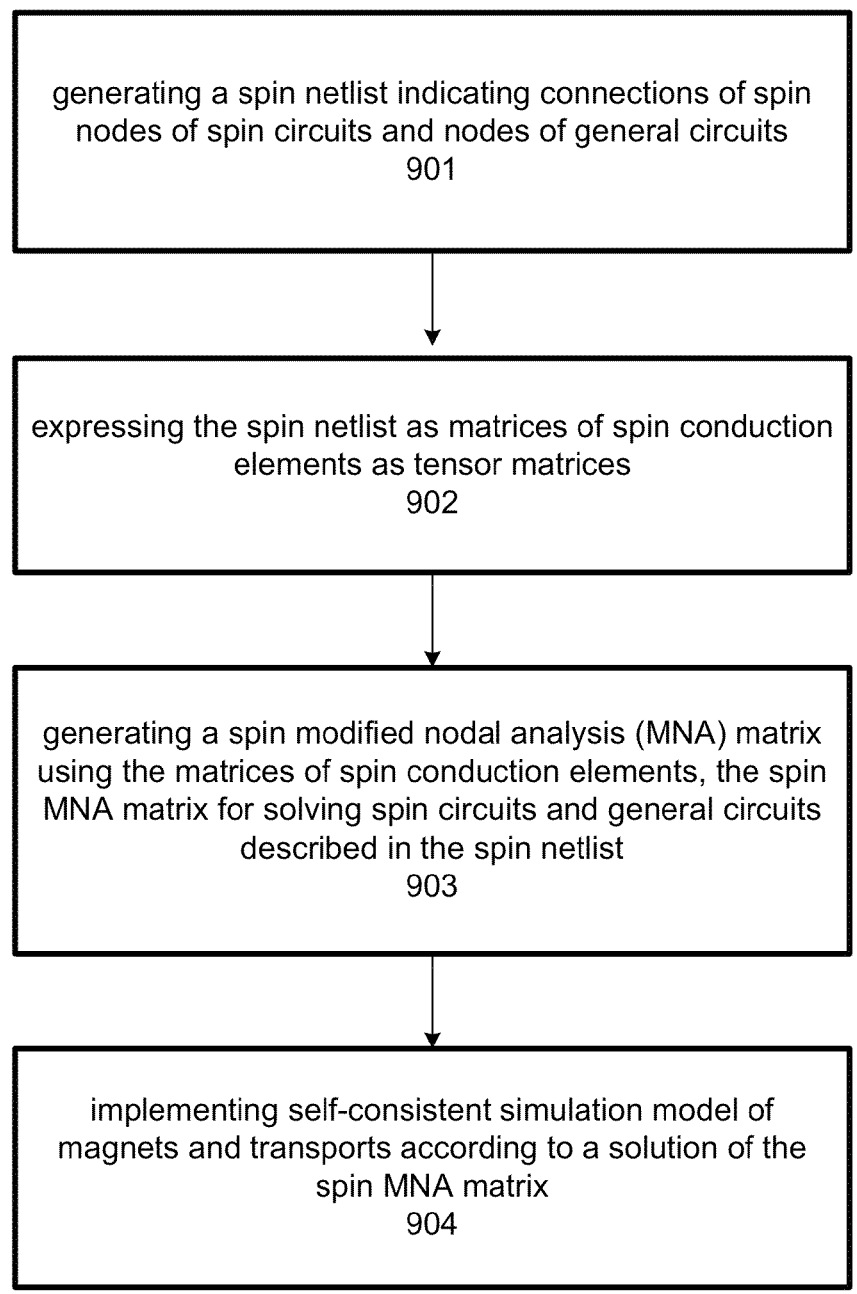
FIG. 9 is a flowchart of a method for modeling and simulating a spintronic integrated circuit (SPINIC), according to one embodiment.

FIG. 9 is a flowchart 900 of a method for modeling and simulating a spintronic integrated circuit (SPINIC), according to one embodiment. The method can be performed as computer executable instructions, stored on a storage medium, and executed on by a processor or virtual processor. Although the blocks in the flowchart with reference to FIG. 9 are shown in a particular order, the order of the actions can be modified. Thus, the illustrated embodiments can be performed in a different order, and some actions/blocks may be performed in parallel.

At block 901, a spin netlist is generated indicating connections of spin nodes of spin circuits and nodes of general circuits. In one embodiment, nodes of spin memory and circuit are identified and a SPICE like netlist is generated. The spin nodes are points of the spintronic integrated circuit where spin dependent transport properties are in equilibrium.

At block 902, the spin netlist is expressed as matrices of spin conduction elements. These spin conductance elements are described as tensor matrices. In one embodiment, the spin conduction elements are expressed as 4×4 tensors as defined by operational physics of the device being simulation. Unlike traditional SPICE, the simulation model here uses tensor impedances instead of only scalar quantities. In one embodiment, generating the spin netlist comprises: inserting a virtual ground element to model gently decaying spin from the spin conductance elements, where the virtual ground element is expressed as one of a Pi-model or a T-model of conductance elements.

In one embodiment, the method further comprises forming a spin conduction matrix, from the spin netlist, to relate vector spin currents with vector spin voltages, the spin conduction matrix having multiple 4×4 matrices of tensors.

At block 903, a spin-MNA matrix is generated using the matrices of spin conduction elements. The spin-MNA accounts for the connectivity and the voltage and current controlled sources. The embodiments describe a spin-MNA to simulate magnetic elements and also fit into a SPICE like simulation infrastructure. The spin-MNA matrix is used for solving spin circuits and general circuits described in the spin netlist.

In one embodiment, the method of generating spin-MNA comprises: incorporating the spin conduction matrix; generating spin connectivity matrices for coupling voltage sources to spin nodes; generating a matrix to capture controlled voltage and current sources; and generating another matrix to capture dependent voltage controlled voltage sources and current controlled voltage sources.

The following process provides details of the method for solving spin currents and voltages in a SPINIC using a spin-MNA in accordance with the embodiments of the disclosure. The SPINIC to be simulated comprises magnets, conduction channels, and tunnel barriers and electronic switching elements. It may also include transitional circuits (e.g., resistors, capacitors, transistors, etc.).

In one embodiment, the method of spin-MNA comprises steps to create a spin admittance matrix (G), spin connectivity matrices (B & C) comprising of connection of the voltage sources, and matrix D to capture spin and charge sources that are not controlled by another node (i.e., independent nodes). The spin-MNA solves the equation $[X]=[A]^{-1}[Z]$, where matrix A comprises matrices G, B, C, and D, where matrix X is a vector comprising unknown node voltage and unknown currents through the voltage sources, and where matrix Z is the vector comprising the voltages of the voltage source and currents at the current sources. As discussed herein, matrix A is a matrix formed based on the connectivity of the SPINIC, location of the voltage and current source. In one embodiment, matrix A is a 4(m+n)×4(m+n) matrix, where 'n' is the number of nodes, and 'm' is the number of independent voltage sources.

The spin-MNA in the embodiments is capable of simulating tensors using the pseudo (or virtual) ground which is introduced to model slow decay of spin (i.e., spin discharge) through the pseudo (or virtual) ground.

In one embodiment, the spin admittance matrix (G) comprises the spin conductivity tensors (4×4 matrices). In one embodiment, the G matrix is an n×n matrix, where each element is filled with a 4×4 conductivity matrix where n is the number of nodes. In such an embodiment the total size of the G matrix becomes 4n×4n after filling the conductances. Each element in the diagonal matrix is equal to the sum of the conductance of each element connected to the corresponding node.

The first diagonal element in the G matrix is the sum of conductances connected to node 1, the second diagonal element in the G matrix is the sum of conductances connected to node 2, and so on. The off diagonal elements in the G matrix are the negative conductance of the element connected to the pair of corresponding nodes. Therefore a spin-resistor between nodes 1 and 2 goes into the G matrix at locations (1, 2) and locations (2, 1) in the G matrix.

In one embodiment, the spin connectivity matrix (B) is formed to capture the connectivity of the spin circuit. The B matrix is an n×m matrix with only 0, Identity matrix I and −I elements. Each location in the matrix corresponds to a particular voltage source (first dimension) or a node (second dimension). In one embodiment, if the positive terminal of the $i^{th}$ voltage source is connected to node k, then the element (i,k) in the B matrix is a 1. In one embodiment, if the negative terminal of the $i^{th}$ voltage source is connected to node k, then the element (i,k) in the B matrix is a −1. Otherwise, elements of the B matrix are zero.

In one embodiment, the C matrix is formed to capture the controlled voltage and current sources. The C matrix is an m×n matrix with only 0, I and −I elements. Each location in the matrix corresponds to a particular node (first dimension) or voltage source (second dimension). In one embodiment, if the positive terminal of the $i^{th}$ voltage source is connected to node k, then the element (k,i) in the C matrix is an identity matrix I. In one embodiment, if the negative terminal of the $i^{th}$ voltage source is connected to node k, then the element (k,i) in the C matrix is a −I. Otherwise, elements of the C matrix are zero.

In one embodiment, the D matrix is an m×m matrix that is composed entirely of zeros. The elements are non-zero if dependent sources such as voltage control voltage sources and current controlled voltage sources are considered. In one embodiment, the method further comprises evaluating current and voltages of the SPINIC according to a solution of the spin-MNA matrix.

In one embodiment, the spin-MNA method for simulating spin-MNA with 'n' nodes and 'm' voltage sources comprises executing the following steps.

In one embodiment, the nodes in the SPINIC are numbered. A reference node is selected (usually the ground node and numbered 0) and remaining n−1 nodes are named. In this embodiment, currents through each source of the SPINIC are also labeled.

In one embodiment, the currents are named. For example, a name is assigned to the current through each voltage source flowing from positive node to negative node of the voltage source.

In one embodiment, after the nodes in the SPINIC are numbered and the current through each voltage source is named, spin KCL is applied. In such an embodiment, spin current conservation law is applied at each node with current into the node to be positive.

In one embodiment, equation for spin voltage at each voltage source is identified. In one embodiment, the equations are rearranged to form the equation $[X]=[A]^{-1}[Z]$. In one embodiment, matrix A is inverted and multiplied with matrix Z to obtain the voltages of the nodes and current of the sources. By solving $[X]=[A]^{-1}[Z]$, relevant currents are computed for the SPINIC.

At block 904, self-consistent simulation model of magnets and transports is implemented according to a solution of the spin-MNA matrix.

FIG. 10A is a spintronic random access memory (STTRAM) cell 1000. In this example, the magnetic tunnel junction (MJT) device is between nodes $N_1$ and $N_2$ and is coupled to transistor M1. Transistor M1 is controllable by word line signal WL while the bit line (BL) signal is coupled to the MJT device. One of the terminals of M1 is coupled to source line (SL). FIG. 10B is a zoomed version 1020 of the MJT device of the STTRAM cell 1000. The MJT device comprises a free magnet, a fixed magnet and an interface layer between free magnet and the fixed magnet. The direction of the voltage of the layers of MJT device are $V_{FM}$ (for free magnet), $V_{OX}$ (for the interface layer), and $V_{FM}$ (for the fixed magnet).

FIG. 10C is a T-model 1030 representation of the spin SPICE macro-model for the MJT coupled to the transistor M1, according to one embodiment. In this embodiment, the component layers of the MJT are expressed as conductance. For example, $G_{FM0}(m)$ (with resistance RF1) is between nodes $N_1$ and $N_2$ for the free magnet, conductance $G_{FM3}(m_3)$ (with resistance RF2) between nodes $N_2$ and one of the terminals of M1 is for the fixed magnet, and a third conductance for the interface layer (with resistance RF3). Each of the conductance is expressed as a 4×4 matrix one of which is illustrated for $G_{FM0}(m)$.

FIG. 10D is a spin netlist 1040 of the STTRAM cell 1000, according to one embodiment. In one embodiment, the netlist 1040 is expressed as SPICE like netlist so that SPICE netlist parsers can parse the netlist with little (if any) overhead. In this netlist a voltage source V3 is defined along with three resistances with the conductances expressed above with reference to FIG. 10C. Another netlisting and modeling example of spin logic device is illustrated with reference to FIGS. 11A-D. FIGS. 11A-D illustrate a non-local spin injection detection device.

FIG. 11A is a top view 1100 of a lateral spin logic device. The lateral spin logic device in this example comprises two nano-magnets and non-magnetic channels. The top view 1100 shows the fixed and free magnets, which are identified as node 3 while the rest of the shaded region is metal 2 (M2). The spin circuit is embedded with nano-magnets to demonstrate the non-limiting effectiveness of the embodiments discussed herein. The lateral spin injection-detection device is an all spin logic device. The device consists of two nano-magnets communicating via a non-magnetic channel.

FIG. 11B is a side view 1120 of the lateral spin logic device. In this view, the lateral spin logic device is shown between the supply voltage plane on the top and the metal ground plane at the bottom. A channel is formed between nodes 1 and 2. The metal 2 (M2) coupling the M3 to the ground plane is indicated by node 4 and is used to model gently decaying of spin to the ground plane.

The device of FIGS. 11A-B operates as an inverting gate for positive applied voltages and a non-inverting gate for negative. Channel connecting nodes 1 to 2 acts as interconnection between the two magnets transporting spin polarized currents.

Intuitively, the operation of the device of FIGS. 11A-B can be explained as follows: the magnets create spin polarized population densities underneath the magnets and setup spin diffusion currents through the channel. The direction of this spin diffusion current is set by the relative strength of the spin polarization of the carriers.

For a ground terminal set near the input magnet it can be shown that the magnet 1 acts as a fixed magnetic terminal, while the second magnet responds to the spin diffused to beneath it, depending on the applied voltages. For a positive applied voltage, the device shown in FIGS. 11A-B acts like an inverting gate, where the output becomes a logical invert of the input. For negative applied voltages, the output becomes a copy of the input magnet's condition.

The sectioned structure of the channel isolates spin logic gates, where the interconnection between gates (concatenation) is achieved via a continuous free layer magnet. The non-reciprocity of (output to input signal transport) spin logic comes from an asymmetry between input and output magnets. This asymmetry can be achieved via, a) an asymmetric overlap of the magnet such that the area of the output is greater than the area of input magnet, b) asymmetric ground condition, c) asymmetric spin injection efficiency, and d) asymmetric spin damping constant.

In one embodiment, the device of FIGS. 11A-B is modeled as a spin circuit comprising of two nano-magnets and non-magnetic conductive elements. In one embodiment, the non-magnetic elements model the behavior of the metal channels connecting the magnets to each other and to the ground. With reference to FIGS. 11A-B, the node-0 is modeled to be the ground and the remaining nodes are numbered as per the convention of traditional MNA.

In this embodiment, nodes 1 and 2 represent the points in the device of FIG. 11A-B just below the magnets representing the ends of the channel. Node 3 is common node shared by the magnets and the supply plane.

Figure 11C:
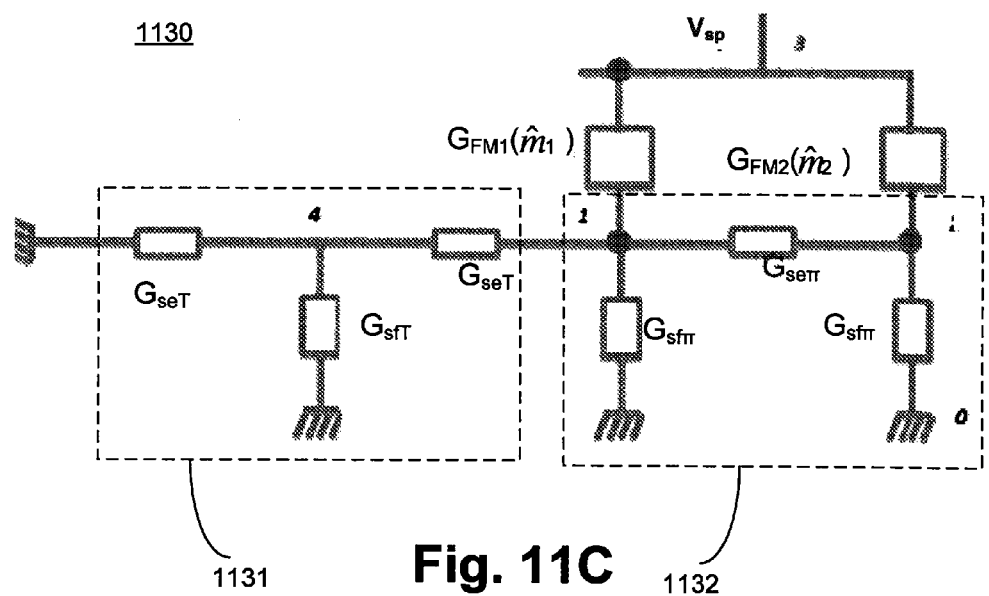
FIG. 11C is a circuit model of the lateral spin logic device, according to one embodiment.

FIG. 11C is a circuit model 1130 of the lateral spin logic device, according to one embodiment. In this embodiment, a T-model 1131 is used to model the ground load. This complex model 1131 for ground provides a distributed conductance model of ground. In other embodiments, a Π-model may be used to model the ground load. In this embodiment, the channel is modeled as a Π-model 1132. In other embodiments, an equivalent T-model may be used to model the channel between nodes 1 and 2.

In one embodiment, the magnetic elements are represented by $G_{FM1}$ & $G_{FM2}$; the non-magnetic channel is represented by the Π-equivalent circuit 1132. In this embodiment, the ground connection branch $B_{10}$ is represented by the T-equivalent circuit 1131. To better relate the model with physical dimensions, the dimensions of Table 5 may be used.

Table 5 illustrates the parameters used for example circuit simulation.

TABLE 5

Parameters used for example circuit simulation

| Variable | Notation | Value | Units (SI) |
|---|---|---|---|
| Saturation Magnetization of the Magnet | $M_s$ | $10^6$ | A/m |
| Damping of the Magnet | α | 0.007 | — |
| Effective Internal Anisotropic Field | $H_{eff}$ | $3.06 \times 10^4$ | A/m |
| Barrier of the magnet | Δ/kT | 40 | — |
| Length of Magnet | $N_s$ | $10^3$-$10^6$ | — |
| Thickness of Magnet | $T_m$ | 3 | Nm |

TABLE 5-continued

Parameters used for example circuit simulation

| Variable | Notation | Value | Units (SI) |
|---|---|---|---|
| Width of Magnet | $W_m$ | 37.8 | Nm |
| Length of Magnet | $L_m$ | 75.7 | Nm |
| Length of channel | $L_c$ | 100 | Nm |
| Thickness of channel | $T_c$ | 200 | Nm |
| Length of ground lead | $L_g$ | 200 | Nm |
| Thickness of ground lead | $T_g$ | 100 | Nm |
| Channel conductivity | $\rho$ | $7 \times 10^{-9}$ | $\Omega \cdot m$ |
| Sharvin conductivity | $G_{sh}$ | $0.5 \times 10^{15}$ | $\Omega^{-1} \cdot m^{-2}$ |
| Polarization | $\alpha_c$ | 0.8 | |

FIG. 11D is a spin netlist 1140 of the lateral spin logic device which is parsed and converted into a spin-MNA matrix for executing spin-MNA method, according to one embodiment. In one embodiment, netlist is parsable by a SPICE like netlist parser.

Based on the method discussed in various embodiments, the spin-MNA equation is generated for the circuit in FIG. 11C. In one embodiment, the G matrix is filled with the spin conductivity elements connecting to nodes 1-4. The elements representing connectivity A(5,3) is filled with an identity matrix such that the applied voltage at node 3 is $V_{sp}$. The row A3 represents the KCL at the node 3 and correspondingly has an identity matrix at element A(3,5).

$$\begin{bmatrix} O \\ O \\ O \\ O \\ V_{sp} \end{bmatrix} = \begin{bmatrix} G_{FM1} + G_{sh1} + G_{Se} & -G_{se\pi} & -G_{FM1} & 0 & 0 \\ -G_{Se\pi} & G_{FM2} + G_{sf\pi} + G_{Se\pi} & -G_{FM2} & 0 & 0 \\ -G_{FM1} & -G_{FM2} & G_{FM1} + G_{FM2} & 0 & I \\ -G_{seT} & 0 & 0 & G_{seT} + G_{seT} + G_{sfT t} & 0 \\ O & O & I & 0 & 0 \end{bmatrix} \begin{bmatrix} V_1 \\ V_2 \\ V_3 \\ V_4 \\ I_{sp} \end{bmatrix} \quad \text{(Eq. 36)}$$

In one embodiment, the self-consistent solution is obtained by solving all the nano-magnet dynamical equations consistently with the transport equations (FIGS. 8A-B). The full set of equations for this example system then becomes $$\frac{\partial \hat{m}_1}{\partial t} = -\gamma \mu_0 [\hat{m}_1 \times \overline{H}_{eff}] + \alpha \left[ \hat{m}_1 \times \frac{\partial \hat{m}_1}{\partial t} \right] + \frac{\overline{I}_{13\perp}}{eN_s} \quad \text{(Eq. 37)}$$

$$\frac{\partial \hat{m}_2}{\partial t} = -\gamma \mu_0 [\hat{m}_2 \times \overline{H}_{eff}] + \alpha \left[ \hat{m}_2 \times \frac{\partial m_2}{\partial t} \right] + \frac{\overline{I}_{23\perp}}{eN_s} \quad \text{(Eq. 38)}$$

where the voltages are derives from Eq. 36.

The following section provides more detail about the G-matrix elements of a non-magnetic distributed channel.

Spin-dependence conduction can be described in a continuous medium (as opposed to a lumped-element circuit) via the drift-diffusion equations. A derivation of normal magnet (NM) spin conductance matrix is described herein. The spin conductances for currents along one direction (x) and one direction (s) of spin are shown, and then generalized to arbitrary directions of spins. The drift-diffusion equations for the current density J, spin current density $J_s$, voltage V, and spin voltage $V_s$ in a non-magnetic material are described as:

$$J = \sigma \frac{dV}{dx} \quad \text{(A1)}$$

$$J_s = \sigma \frac{dV_s}{dx} \quad \text{(A2)}$$

Current continuity implies (Kirchhoff current law)

$$\frac{dJ}{dx} = 0 \quad \text{(A3)}$$

$$\frac{dJ_s}{dx} = \frac{\sigma}{\lambda^2} V_s \quad \text{(A4)}$$

where the conductivity is $\sigma$, and the spin diffusion length is $\lambda = \sqrt{D \tau_{sf}}$. A general solution for these equations is J=Constant $$V_s = a\exp(x/\lambda) + b\exp(-x/\lambda) \quad \text{(A4b)}$$

$$J_s = \frac{\sigma a}{\lambda} \exp(x/\lambda) - \frac{\sigma b}{\lambda} \exp(-x/\lambda) \quad \text{(A5)}$$

where the boundary conditions set the coefficients a, b. The specific solution for the uniform conductor of length L is:

$$J = \sigma(V_2 - V_1)/L \quad \text{(A6)}$$

$$V_{s1} = a/E + bE \quad \text{(A7)}$$

$$V_{s2} = aE + b/E \quad \text{(A8)}$$

$$J_{s,in} = \frac{\sigma a}{\lambda E} - \frac{\sigma b E}{\lambda} \quad \text{(A9)}$$

$$J_{s,out} = \frac{\sigma a E}{\lambda} - \frac{\sigma b}{\lambda E} \quad \text{(A10)}$$

where E is designated as E=exp(L/(2λ));
From these equations, and for the cross-sectional area A of the conductor $$G = \sigma A / L \quad \text{(A11)}$$

According to the above notation, the following relations must be satisfied for the Π-network $$J_{s,in} = J_{sp} - J_{s1} \quad \text{(A12)}$$

$$J_{s,out} = J_{sp} + J_{s2} \quad \text{(A13)}$$

$$AJ_{s1} = G_{sf\pi} V_{s1} \quad \text{(A14)}$$

$$AI_{s2} = G_{sf\pi} V_{s2} \quad \text{(A15)}$$

$$AJ_{p,s} = G_{se\pi}(V_{s2} - V_{s1}) \quad \text{(A16)}$$

for all values of the boundary conditions (specified by a, b). Taking a special case of a=0, b=1, the following equations are derived:

$$\frac{A\sigma E}{\lambda} = G_{se\pi}\left(E - \frac{1}{E}\right) + G_{sf\pi}E \quad (A17)$$

$$\frac{A\sigma}{\lambda E} = G_{se\pi}\left(E - \frac{1}{E}\right) - G_{sf\pi}\frac{1}{E} \quad (A18)$$

which have the solution:

$$G_{se\pi} = \frac{\sigma A}{\lambda}\operatorname{cosech}\left(\frac{L}{\lambda}\right) \quad (A19)$$

$$G_{sf\pi} = \frac{\sigma A}{\lambda}\tanh\left(\frac{L}{2\lambda}\right) \quad (A20)$$

Hence, the conductance for the series branch of the Π network is [18]:

$$G_{se\pi} = \begin{bmatrix} \frac{A_{ch}}{\rho_{ch}L_c} & 0 & 0 & 0 \\ 0 & \frac{A_{ch}}{\rho_{ch}\lambda_s}\operatorname{csch}\left(\frac{L_c}{\lambda_s}\right) & 0 & 0 \\ 0 & 0 & \frac{A_{ch}}{\rho_{ch}\lambda_s}\operatorname{csch}\left(\frac{L_c}{\lambda_s}\right) & 0 \\ 0 & 0 & 0 & \frac{A_{ch}}{\rho_{ch}\lambda_s}\operatorname{csch}\left(\frac{L_c}{\lambda_s}\right) \end{bmatrix} \quad (A21)$$

The conductance for the parallel branch of the Π network is:

$$G_{sf\pi} = \begin{bmatrix} 0 & 0 & 0 & 0 \\ 0 & \frac{A_{ch}}{\rho_{ch}\lambda_s}\tanh\left(\frac{L_c}{2\lambda_s}\right) & 0 & 0 \\ 0 & 0 & \frac{A_{ch}}{\rho_{ch}\lambda_s}\tanh\left(\frac{L_c}{2\lambda_s}\right) & 0 \\ 0 & 0 & 0 & \frac{A_{ch}}{\rho_{ch}\lambda_s}\tanh\left(\frac{L_c}{2\lambda_s}\right) \end{bmatrix} \quad (A22)$$

The following description discloses Π to T-equivalent circuit transformation.

Spin-dependent conductance with spin relaxation can be equivalently represented by Π-shaped or T-shaped networks. A general relation between these two approaches is described. In both cases the vector voltages at the terminals, V1 and V2 are the same. In the Π-network, the spin-relaxation currents are $$I_1 = G_{sf\pi}V_1 \quad (B1)$$

$$I_2 = G_{sf\pi}V_2 \quad (B2)$$

and the current passing through the center conductance is:

$$I_p = G_{se\pi}(V_2 - V_1) \quad (B3)$$

They are related to the total currents entering and leaving the network as follows $$I_{in} = I_p - I_1 \quad (B4)$$

$$I_{out} = I_p + I_2 \quad (B5)$$

Using these relations in (C4, C5) is convenient to express the sum and the difference of the in- and out-currents.

$$I_{out} - I_{in} = G_{sf\pi}(V_2 + V_1) \quad (B6)$$

$$I_{out} + I_{in} = (2G_{se\pi} + G_{sf\pi})(V_2 - V_1) \quad (B7)$$

Similarly for the T-network, the current from the middle node to the ground is related to the vector voltage at this node as follows:

$$I_m = G_{sfT}V_m \quad (B8)$$

and the in- and out-currents are expressed as:

$$I_{in} = G_{seT}(V_m - V_1) \quad (B9)$$

$$I_{out} = G_{seT}(V_2 - V_m) \quad (B10)$$

The current conservation results in the following:

$$I_{out} = I_{in} + I_m \quad (B11)$$

The voltage at the middle node is thus related (for non-zero spin relaxation) to the in- and out-currents as:

$$V_m = G_{seT}^{-1}(I_{out} - I_{in}) \quad (B12)$$

As before, the unity matrix I is expressed as:

$$(I + 2G_{seT}G_{sfT}^{-1})(I_{out} - I_{in}) = G_{seT}(V_2 + V_1) \quad (B13)$$

$$I_{out} + I_{in} = G_{seT}(V_2 - V_1) \quad (B14)$$

Since the two expressions for in- and out-currents should be equivalent, the following relations between non-zero conductances must hold:

$$G_{seT} = 2G_{se\pi} + G_{sf\pi} \quad (B15)$$

$$G_{sf\pi}^{-1} = G_{seT}^{-1} + 2G_{sfT}^{-1} \quad (B16)$$

Simple algebraic manipulations permit the expression of the T-conductances in terms of Π (Pi) conductances, which can be expressed as:

$$G_{sfT} = G_{sf\pi}G_{se\pi}^{-1}G_{sf\pi} + 2G_{sf\pi} \quad (B17)$$

Persons skilled in the art will note that this derivation is not trivially reduced to the results of the traditional electronic network theory, because the conductances are matrices rather than scalars.

The following section described G-matrix elements of FM expressed as spin reflection and transmission coefficients. Elements of a 4×4 conduction matrix of a ferro-magnetic metal in contact with a normal metal are expressed in terms of spin reflection and transmission coefficients. The conduction matrix elements of a FM are described as phenomenological constants extracted from experimental properties of the FM-NM conduction. Here, a description of the conduction matrix elements of a FM is provided that is derived from an ab initio approach. The conduction matrix is expressed as:

$$G_{FM} = \begin{bmatrix} G & \alpha G & 0 & 0 \\ \alpha G & G & 0 & 0 \\ 0 & 0 & G_{SL} & G_{FL} \\ 0 & 0 & -G_{FL} & G_{SL} \end{bmatrix} \quad (C1)$$

can also be written in terms of spin scattering conductance elements as:

$$G_{FM} = \begin{bmatrix} G_{\uparrow\uparrow} + G_{\downarrow\downarrow} & G_{\uparrow\uparrow} - G_{\downarrow\downarrow} & 0 & 0 \\ G_{\uparrow\uparrow} - G_{\downarrow\downarrow} & G_{\uparrow\uparrow} + G_{\downarrow\downarrow} & 0 & 0 \\ 0 & 0 & 2\operatorname{Re}G_{\uparrow\downarrow} & 2\operatorname{Im}G_{\uparrow\downarrow} \\ 0 & 0 & -2\operatorname{Im}G_{\uparrow\downarrow} & 2\operatorname{Re}G_{\uparrow\downarrow} \end{bmatrix} \quad (C2)$$

where $G_{\uparrow\uparrow}$, $G_{\downarrow\downarrow}$ and $G_{\uparrow\downarrow}$ are the matrix elements derived from spin scattering at the FM-NM interface. The conduction matrix elements of an FM-NM interface can be described in terms of the reflection and transmission properties of the spin up and spin down electrons incident from an NM to FM.

$$G^{\uparrow\uparrow} = \frac{e^2}{h} \sum_{n \in NM} \sum_{m \in FM} |t_\uparrow^{nm}|^2 \qquad (C3)$$

$$G^{\downarrow\downarrow} = \frac{e^2}{h} \sum_{n \in NM} \sum_{m \in FM} |t_\downarrow^{nm}|^2 \qquad (C4)$$

$$G^{\uparrow\downarrow} = G^{\downarrow\uparrow*} = \frac{e^2}{h} \sum_{n \in NM} \left(1 - \sum_{m \in NM} r_\uparrow^{nm} r_\downarrow^{nm*}\right) \qquad (C5)$$

where $e^2/h$ is the conductance per spin of a ballistic channel with ideal contacts; $t_\uparrow^{nm}$, $t_\downarrow^{nm}$ are the transmission coefficients for up and down spin electrons from NM to FM; $r_\uparrow^{nm}$, $r_\downarrow^{nm}$ are the reflection coefficients of the up and down spin electrons at the FM-NM interface; n is the number of modes in the NM, m is the number of modes in the FM. The number of modes in a metal NM can in-turn be written from the metal's Fermi wave vector $k_f$. Assuming that $r_\uparrow^{nm}$, $r_\downarrow^{nm}$ are close to zero for many material systems, which simplifies the spin torque conductance to $G_{SL}$ to:

$$G_{SL} = 2\text{Re} G^{\uparrow\downarrow} = \frac{2e^2}{h} n = \frac{2e^2}{h} \frac{A k_f^2}{4\pi} \qquad (C6)$$

The following section shows the derivation for free magnetic layer conduction matrix.

The G-Matrix for a free layer FM with an arbitrary magnetic moment direction ($\hat{m}$) is derived in this section. Let $\phi$ be the angle of the magnetic moment with z-axis and $\theta$ be the angle of the projection of ($\hat{m}$), with x-axis. $\hat{m}$ can be expressed in co-ordinate system xyz as:

$$\hat{m} = \cos\theta \sin\phi \cdot \hat{x} + \sin\theta \sin\phi \cdot \hat{y} + \cos\phi \cdot \hat{z} \qquad (D1)$$

A new co-ordinate system XYZ is chosen such that, $\hat{m}$ is collinear with the new X-axis.

$$\hat{X} = \hat{m} \qquad (D2)$$

$$\hat{Y} = -(\hat{X} \times \hat{x})/\|\hat{X} \times \hat{x}\| \qquad (D3)$$

$$\hat{Z} = \hat{X} \times \hat{Y} \qquad (D4)$$

In the new co-ordinate system:

$$\vec{I}_{XYZ} = G_{FN}(\hat{x}) \vec{V}_{XYZ} \qquad (D5)$$

where $G_0$ is the matrix described in section V. The following (D6) and (D7) can be substituted and rearranged to obtain current, voltage relation (D8) in the xyz co-ordinate system.

$$\vec{I}_{XYZ} = R \vec{I}_{xyz} \qquad (D6)$$

$$\vec{V}_{XYZ} = R \vec{V}_{xyz} \qquad (D7)$$

$$\vec{I}_{xyz} = R^{-1} G_{FN}(\hat{x}) R \vec{V}_{xyz} \qquad (D8)$$

Hence, the conductance matrix for an FM with magnetic moment along an arbitrary direction is given by:

$$G_{FN}(\hat{m}) = R^{-1}(\hat{m}) G_{FN}(\hat{x}) R(\hat{m}) \qquad (D9)$$

The following section described the conversion from spinor basis to vector basis i.e., conversion between spinor spin current/voltage basis to 4-component vector current/voltage basis.

The derivations for magneto-electronic circuit theory are often performed in the spinor basis for the electrons. For convenience the conversion is listed from spinor basis to Cartesian vector basis as well as 4-component current basis. The current in a spinor basis can be written as:

$$\hat{I} = (I_c \hat{1} + \vec{I}_s \cdot \vec{\sigma})/2 \qquad (E1)$$

where $\vec{\sigma}$ is the Pauli spin matrix:

$$\vec{\sigma} = \sigma_x \hat{x} + \sigma_y \hat{y} + \sigma_z \hat{z} \qquad (E2)$$

which yields, $$\hat{I} = \begin{bmatrix} I_{\uparrow\uparrow} & I_{\uparrow\downarrow} \\ I_{\downarrow\uparrow} & I_{\downarrow\downarrow} \end{bmatrix} = \begin{bmatrix} I_c + I_z & I_x - iI_y \\ I_x + iI_y & I_c - I_z \end{bmatrix} \qquad (E3)$$

Hence, the 4-component current vector can be derived from the spinor current as follows:

$$\vec{I} = \frac{1}{2} \begin{bmatrix} I_{\uparrow\uparrow} + I_{\downarrow\downarrow} \\ I_{\uparrow\downarrow} + I_{\downarrow\uparrow} \\ i(I_{\uparrow\downarrow} - I_{\downarrow\uparrow}) \\ I_{\uparrow\uparrow} - I_{\downarrow\downarrow} \end{bmatrix} \qquad (E4)$$

Similarly, 4-component vector spin voltage can be derived from spinor voltage as follows:

$$\vec{V} = \frac{1}{2} \begin{bmatrix} V_{\uparrow\uparrow} + V_{\downarrow\downarrow} \\ V_{\uparrow\downarrow} + V_{\downarrow\uparrow} \\ i(V_{\uparrow\downarrow} - V_{\downarrow\uparrow}) \\ V_{\uparrow\uparrow} - V_{\downarrow\downarrow} \end{bmatrix} \qquad (E5)$$

The following section describes the thermal noise modeling of nanomagnets.

The dynamics of nano-magnets are strongly affected by the thermal noise. Thermal noise in a nano-magnet manifests as fluctuations to the internal anisotropic field. The thermal noise can be considered as a result of the microscopic degrees of freedom of the conduction electrons and the lattice of the ferro-magnetic element. At room temperature T, the thermal noise is described by a Gaussian white noise (with a time domain Dirac-delta auto-correlation). The noise field acts isotropically on the magnet. In presence of the noise, the LLG equation can be written as:

$$\frac{\partial \hat{m}}{\partial t} = -\gamma \mu_0 [\hat{m} \times \overline{H}_{\text{eff}}(T)] + \alpha \left[\hat{m} \times \frac{\partial m}{\partial t}\right] - \frac{\vec{I}_\perp}{eN_s} \qquad (F1)$$

where equation 34 is modified by adding temperature dependence. The internal field is then described as:

$$\overline{H}_{\text{eff}}(T) = \overline{H}_{\text{eff}} + (H_i \hat{x} + H_j \hat{y} + H_k \hat{z}) \qquad (F2)$$

-continued $$\langle H_l(t) \rangle = 0 \tag{F3}$$

$$\langle H_l(t) H_k(t') \rangle = \frac{2\alpha k_B T}{\mu_0^2 \gamma M_s V} \delta(t-t') \delta_{lk} \tag{F4}$$

The initial conditions of the magnets should also be randomized to be consistent with the distribution of initial angles of magnet moments in a large collection of magnets. At temperature T, the initial angle of the magnets is expressed as follows:

$$\langle \theta^2 \rangle = \frac{kT}{M_s V \mu_0 H_{ani}} \tag{F5}$$

The following section describes the equivalent conductances in series and parallel. The equivalent conductance of a two spin conductance elements connected in parallel is expressed as:

$$G_\| = G_1 + G_2 \tag{G1}$$

$$G_{se} = (G_1 + G_2)^{-1} G_1 G_2 \tag{G2}$$

The rule for voltage division says, voltage across conductance i=1, 2 is expressed as:

$$\Delta V_i = (G_1 + G_2)^{-1} G_i V \tag{G3}$$

Figure 12:
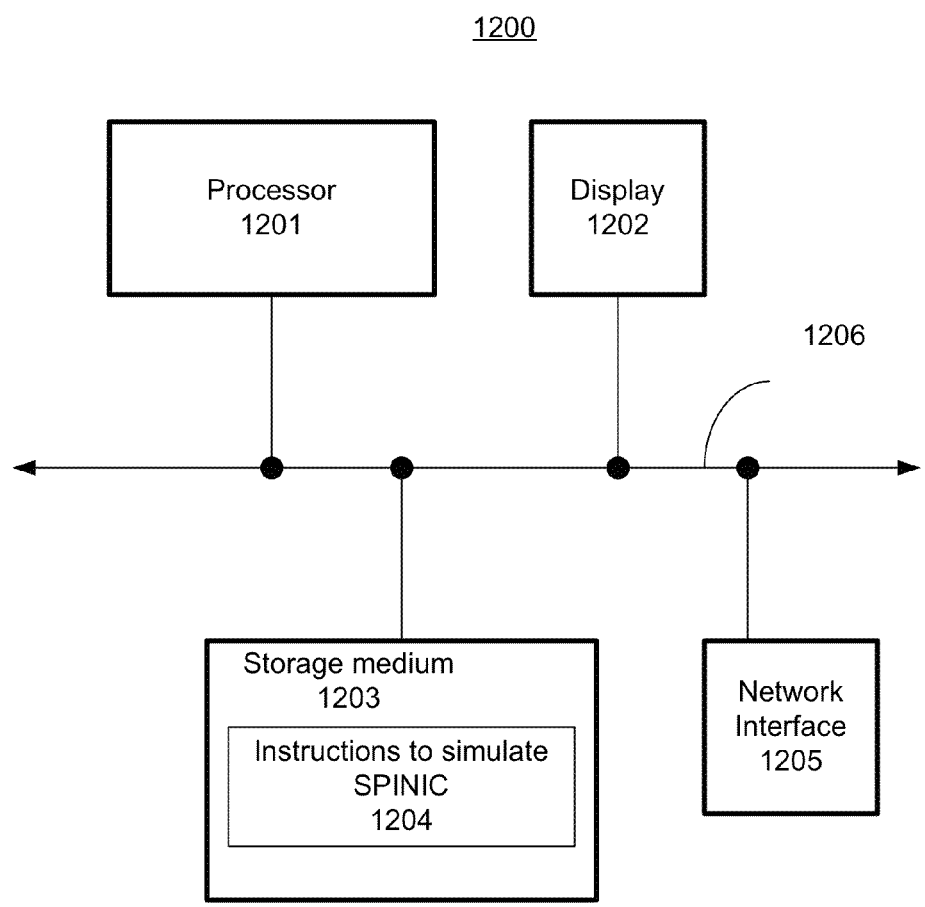
FIG. 12 is a computer system with SPINIC and/or instructions to execute the processes for simulating and modeling SPINIC, according to one embodiment of the disclosure.

FIG. 12 illustrates a block diagram of an embodiment of a computing device 1200 which is operable to simulate SPINICs using the embodiments discussed herein. In one embodiment, computing device 1200 represents a mobile computing device, such as a computing tablet, a mobile phone or smartphone, a wireless-enabled e-reader, or other wireless mobile device. It will be understood that certain components are shown generally, and not all components of such a device are shown in device 1200.

In one embodiment, computing device 1200 includes a processor 1201, a display unit 1202, a memory (or storage medium) 1203, computer executable instructions 1204 to simulate SPINICs, and a network interface 1205. The components are coupled together by a communication link 1206. In one embodiment, network interface 1205 is a wireless interface so that a system embodiment may be incorporated into a wireless device, for example, cell phone or personal digital assistant. In other embodiments, other types of interfaces may be used.

In one embodiment, processor 1201 can include one or more physical devices, such as microprocessors, application processors, microcontrollers, programmable logic devices, or other processing means. The processing operations performed by processor 1201 include the execution of an operating platform or operating system on which applications and/or device functions are executed.

In one embodiment, computing device 1200 includes audio subsystem, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1200, or connected to the computing device 1200. In one embodiment, a user interacts with the computing device 1200 by providing audio commands that are received and processed by processor 1201.

Display unit 1202 represents hardware (e.g., display devices) and software (e.g., drivers) components that provide a visual and/or tactile display for a user to interact with the computing device 1200. Display unit 1200 includes display interface which includes the particular screen or hardware device used to provide a display to a user. In one embodiment, display unit 1200 includes a touch screen (or touch pad) device that provides both output and input to a user.

Elements of embodiments are also provided as a machine-readable medium (e.g., memory 1203) for storing the computer-executable instructions 1204 (e.g., instructions to implement any other processes discussed herein). The machine-readable medium (e.g., memory 1203) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In one embodiment, the network interface 1205 can include multiple different types of connectivity. In one embodiment, network interface 1205 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity refers to wireless connectivity that is not cellular, and can include personal area networks (such as Bluetooth, Near Field, etc), local area networks (such as Wi-Fi), and/or wide area networks (such as WiMax), or other wireless communication.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, a method for simulating spintronic integrated circuit, the method comprising: generating a spin netlist indicating connections of spin nodes of spin circuits and nodes of general circuits; and modifying a modified nodal analysis (MNA) matrix for general circuits to generate a spin-MNA matrix for solving spin circuits and general circuits of the spin netlist.

In one embodiment, generating the spin netlist comprises: indicating the spin circuits as spin conductance elements as tensors; and inserting a virtual ground element to model gently decaying spin from the spin conductance elements.

In one embodiment, the spin conductance elements are expressed as 4×4 matrix of tensors. In one embodiment, the virtual ground element is expressed as one of a Π-model or a T-model of conductance elements. In one embodiment, forming a spin conduction matrix, from the spin netlist, to relate vector spin currents with vector spin voltages, the spin conduction matrix having multiple 4×4 matrices of tensors.

In one embodiment, generating the spin-MNA matrix comprises: incorporating the spin conduction matrix; generating spin connectivity matrices for coupling voltage sources to spin nodes; generating a matrix to capture controlled voltage and current sources; and generating another matrix to capture dependent voltage controlled voltage sources and current controlled voltage sources.

In one embodiment, generating a self-consistent coupled spin transport-magnetization dynamics model for solving spin integrated circuits. In one embodiment, the spin nodes are points of the spintronic integrated circuit where spin dependent transport properties are in equilibrium. In one embodiment, evaluating current and voltages of the spintronics integrated circuit according to a solution of the spin-MNA matrix.

In another example, a method for simulating spintronic integrated circuit, the method comprising: generating a spin netlist indicating connections of spin nodes of spin circuits and nodes of general circuits; expressing the spin netlist as matrices of spin conduction elements as tensor matrices; generating a spin modified nodal analysis (MNA) matrix using the matrices of spin conduction elements, the spin MNA matrix for solving spin circuits and general circuits described in the spin netlist; and implementing self-consistent simulation model of magnets and transports according to a solution of the spin MNA matrix.

In one embodiment, generating the spin netlist comprises: indicating the spin circuits as spin conductance elements expressed as tensors; and inserting a virtual ground element to model gently decaying spin from the spin conductance elements.

In another example, a machine-readable storage medium is provided having machine executable instructions that when executed cause a machine to perform a method according to any one of methods discussed herein.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A computer implemented method for simulating spintronic integrated circuit, the method comprising:
   generating, by a processor, a spin netlist indicating connections of spin nodes of spin circuits and nodes of general circuits;
   expressing the spin netlist as matrices of spin conduction elements; and
   generating, by the processor, a spin modified nodal analysis (MNA) matrix using the matrices of spin conduction elements for solving spin circuits and general circuits of the spin netlist.

2. The method of claim 1, wherein generating the spin netlist comprises:
   indicating the spin circuits as spin conductance elements as tensors; and
   inserting a virtual ground element to model gently decaying spin from the spin conductance elements.

3. The method of claim 2, wherein the spin conductance elements are expressed as 4×4 matrix of tensors.

4. The method of claim 2, wherein the virtual ground element is expressed as one of a Pi-model or a T-model of conductance elements.

5. The method of claim 1 further comprises:
   forming a spin conduction matrix, from the spin netlist, to relate vector spin currents with vector spin voltages, the spin conduction matrix having multiple 4×4 matrices of tensors.

6. The method of claim 5, wherein generating the spin MNA matrix comprises:
   incorporating the spin conduction matrix;
   generating spin connectivity matrices for coupling voltage sources to spin nodes;
   generating a matrix to capture controlled voltage and current sources; and
   generating another matrix to capture dependent voltage controlled voltage sources and current controlled voltage sources.

7. The method of claim 1 further comprises generating a self-consistent coupled spin transport-magnetization dynamics model for solving spin integrated circuits.

8. The method of claim 1, wherein the spin nodes are points of the spintronic integrated circuit where spin dependent transport properties are in equilibrium.

9. The method of claim 1 further comprises: evaluating current and voltages of the spintronics integrated circuit according to a solution of the spin MNA matrix.

10. A machine-readable storage medium having machine executable instructions that when executed cause a machine to perform a method for simulating spintronic integrated circuit, the method comprising:
    generating a spin netlist indicating connections of spin nodes of spin circuits and nodes of general circuits;

expressing the spin netlist as matrices of spin conduction elements; and generating a spin modified nodal analysis (MNA) matrix using the matrices of spin conduction elements for solving spin circuits and general circuits of the spin netlist.

11. The machine-readable storage medium of claim 10, wherein generating the spin netlist comprises:
indicating the spin circuits as spin conductance elements as tensors; and
inserting a virtual ground element to model gently decaying spin from the spin conductance elements.

12. The machine-readable storage medium of claim 11, wherein the spin conductance elements are expressed as 4×4 matrix of tensors.

13. The machine-readable storage medium of claim 11, wherein the virtual ground element is expressed as one of a Pi-model or a T-model of conductance elements.

14. The machine-readable storage medium of claim 10, wherein expressing the spin netlist as matrices of spin conduction elements comprises:
forming a spin conduction matrix, from the spin netlist, to relate vector spin currents with vector spin voltages, the spin conduction matrix having multiple 4×4 matrices of tensors.

15. The machine-readable storage medium of claim 14, wherein generating the spin MNA matrix comprises:
incorporating the spin conduction matrix;
generating spin connectivity matrices for coupling voltage sources to spin nodes;
generating a matrix to capture controlled voltage and current sources; and
generating another matrix to capture dependent voltage controlled voltage sources and current controlled voltage sources.

16. The machine-readable storage medium of claim 10 having further machine executable instructions that when executed cause the machine to perform a further method comprising generating a self-consistent coupled spin transport-magnetization dynamics model for solving spin integrated circuits.

17. A computer implemented method for simulating spintronic integrated circuit, the method comprising:
generating a spin netlist indicating connections of spin nodes of spin circuits and nodes of general circuits;
expressing the spin netlist as matrices of spin conduction elements as tensor matrices;
generating a spin modified nodal analysis (MNA) matrix using the matrices of spin conduction elements, the spin MNA matrix for solving spin circuits and general circuits described in the spin netlist; and
implementing self-consistent simulation model of magnets and transports according to a solution of the spin MNA matrix.

18. The method of claim 17, wherein generating the spin netlist comprises:
indicating the spin circuits as spin conductance elements expressed as tensors; and
inserting a virtual ground element to model gently decaying spin from the spin conductance elements.

19. A machine-readable storage medium having machine executable instructions that when executed cause a machine to perform a method for simulating spintronic integrated circuit, the method comprising:
generating a spin netlist indicating connections of spin nodes of spin circuits and nodes of general circuits;
expressing the spin netlist as matrices of spin conduction elements as tensor matrices;
generating a spin modified nodal analysis (MNA) matrix using the matrices of spin conduction elements, the spin MNA matrix for solving spin circuits and general circuits described in the spin netlist; and
implementing self-consistent simulation model of magnets and transports according to a solution of the spin MNA matrix.

20. The machine-readable storage medium of claim 19, wherein generating the spin netlist comprises:
indicating the spin circuits as spin conductance elements expressed as tensors; and
inserting a virtual ground element to model gently decaying spin from the spin conductance elements.

21. An spintronic integrated circuit designed in accordance with a circuit model designed by a computer implemented method for simulating spintronic integrated circuit, the method comprising:
generating a spin netlist indicating connections of spin nodes of spin circuits and nodes of general circuits;
expressing the spin netlist as matrices of spin conduction elements; and
generating a spin modified nodal analysis (MNA) matrix using the matrices of spin conduction elements for solving spin circuits and general circuits of the spin netlist.

* * * * *